United States Patent
Miyasaka

(10) Patent No.: US 10,470,296 B2
(45) Date of Patent: Nov. 5, 2019

(54) PRINTED CIRCUIT BOARD, PRINTED WIRING BOARD, AND DIFFERENTIAL TRANSMISSION CIRCUIT

(71) Applicant: CANON KABUSHIKI KAISHA, Tokyo (JP)

(72) Inventor: Jin Miyasaka, Nagareyama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/518,135

(22) PCT Filed: Oct. 22, 2015

(86) PCT No.: PCT/JP2015/080472
§ 371 (c)(1),
(2) Date: Apr. 10, 2017

(87) PCT Pub. No.: WO2016/072337
PCT Pub. Date: May 12, 2016

(65) Prior Publication Data
US 2017/0303391 A1  Oct. 19, 2017

(30) Foreign Application Priority Data

Nov. 4, 2014 (JP) ................................ 2014-223999
Oct. 2, 2015 (JP) ................................ 2015-196419

(51) Int. Cl.
H05K 1/02 (2006.01)
H05K 1/18 (2006.01)

(52) U.S. Cl.
CPC ......... *H05K 1/0245* (2013.01); *H05K 1/0228* (2013.01); *H05K 1/18* (2013.01);
(Continued)

(58) Field of Classification Search
CPC . H01P 1/02; H01P 1/148; H01L 25/02; H01L 25/0272; H01L 23/528; H04B 3/00; H04B 3/03; H04B 3/23
(Continued)

(56) References Cited

U.S. PATENT DOCUMENTS 5,027,088 A * 6/1991 Shimizu .................. H01P 3/081
 333/1
5,430,247 A * 7/1995 Bockelman ........... H01L 23/528
 174/250
(Continued)

FOREIGN PATENT DOCUMENTS

JP H05-136650 A 6/1993
JP 2001-060746 A 3/2001
(Continued)

OTHER PUBLICATIONS

PCT Preliminary Report on Patentability dated May 9, 2017 in PCT Application No. PCT/JP2015/080472.
(Continued)

*Primary Examiner* — Tuan T Dinh
(74) *Attorney, Agent, or Firm* — Venable LLP

(57) ABSTRACT

Provided is a printed circuit board including a first semiconductor device and a second semiconductor device mounted on a printed wiring board, the printed wiring board including a first and a second differential signal wirings each formed of a pair of signal transmission lines. The pair of signal transmission lines forming the first differential signal wiring are wired to have a relative arrangement in which one signal transmission line and another signal transmission line cross with each other at least once in the first differential signal wiring in a wiring direction thereof. The pair of signal transmission lines forming the second differential signal wiring are wired to have a relative arrangement in which one signal transmission line and another signal transmission line (Continued)

cross with each other at least once in the second differential signal wiring in a wiring direction thereof.

14 Claims, 11 Drawing Sheets

(52) U.S. Cl.
CPC . *H05K 1/0243* (2013.01); *H05K 2201/09245* (2013.01); *H05K 2201/10159* (2013.01)

(58) Field of Classification Search
USPC .................................. 361/761, 764, 777–784
See application file for complete search history.

(56) References Cited

U.S. PATENT DOCUMENTS

| | | | | |
|---|---|---|---|---|
| 6,259,745 | B1* | 7/2001 | Chan ........................ | H04B 3/23 370/294 |
| 7,627,043 | B2* | 12/2009 | Horowitz ................. | H04B 3/32 326/101 |
| 2009/0003464 | A1* | 1/2009 | Matsubara .......... | H04L 25/0272 375/257 |
| 2009/0189708 | A1* | 7/2009 | Merritt .................... | H01P 3/026 333/1 |
| 2010/0067154 | A1* | 3/2010 | Deng ...................... | H01L 23/60 361/56 |
| 2010/0104029 | A1* | 4/2010 | Lee .......................... | H04B 3/50 375/257 |
| 2010/0188175 | A1* | 7/2010 | Ishibashi ............. | H04L 25/0298 333/22 R |
| 2011/0305060 | A1 | 12/2011 | Ichimura et al. | |
| 2012/0155043 | A1 | 6/2012 | Miyasaka | |
| 2012/0229998 | A1* | 9/2012 | Kagaya ..................... | H01P 1/02 361/777 |
| 2012/0275122 | A1* | 11/2012 | Howard .................. | H01P 1/184 361/748 |

FOREIGN PATENT DOCUMENTS

| | | |
|---|---|---|
| JP | 2006-041193 A | 2/2006 |
| JP | 2011-258775 | 12/2011 |

OTHER PUBLICATIONS

Japanese Office Action dated Jul. 16, 2019 during prosecution of related Japanese application No. 2015-196419. (English-language machine translation included.).

* cited by examiner

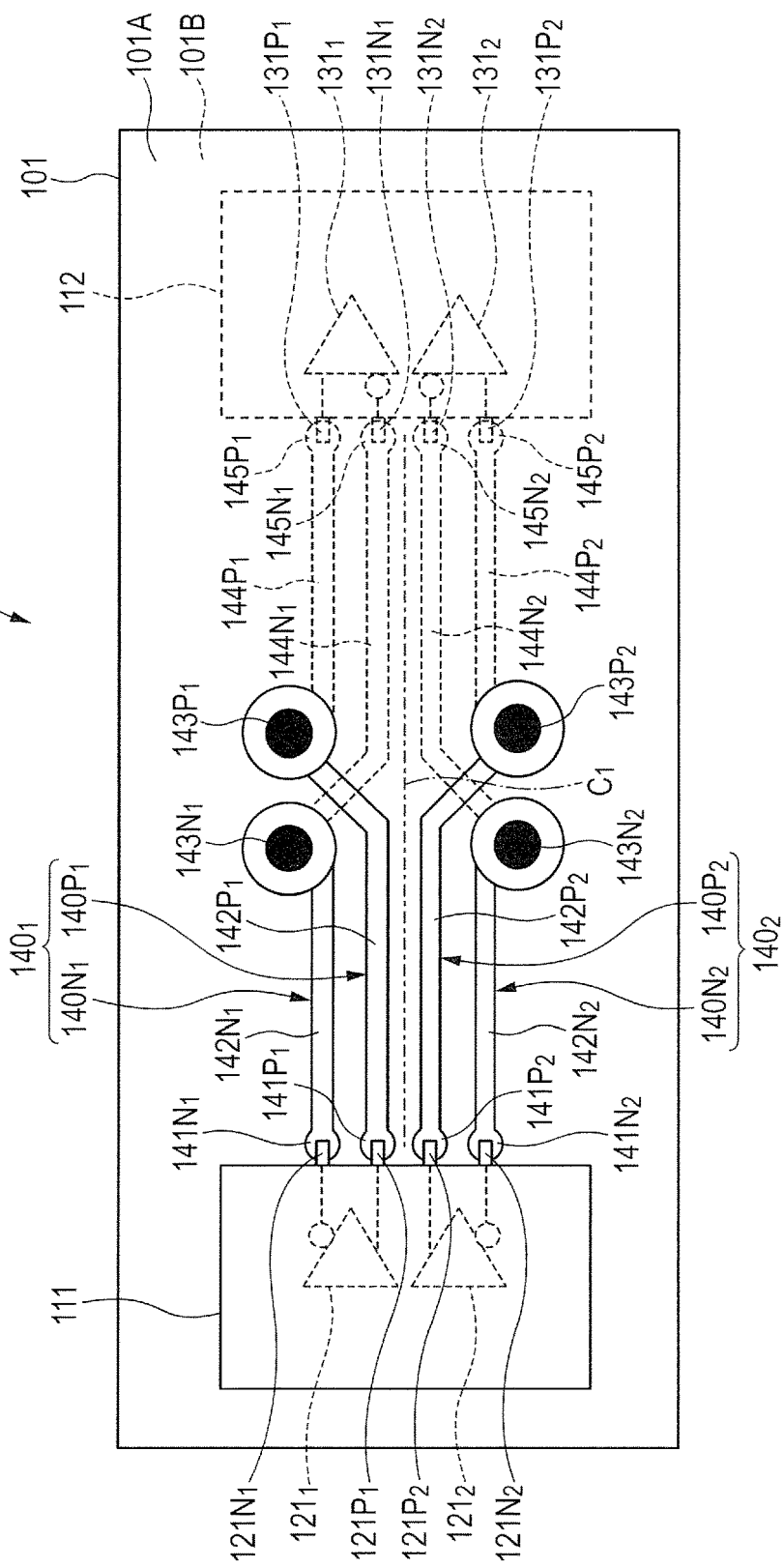

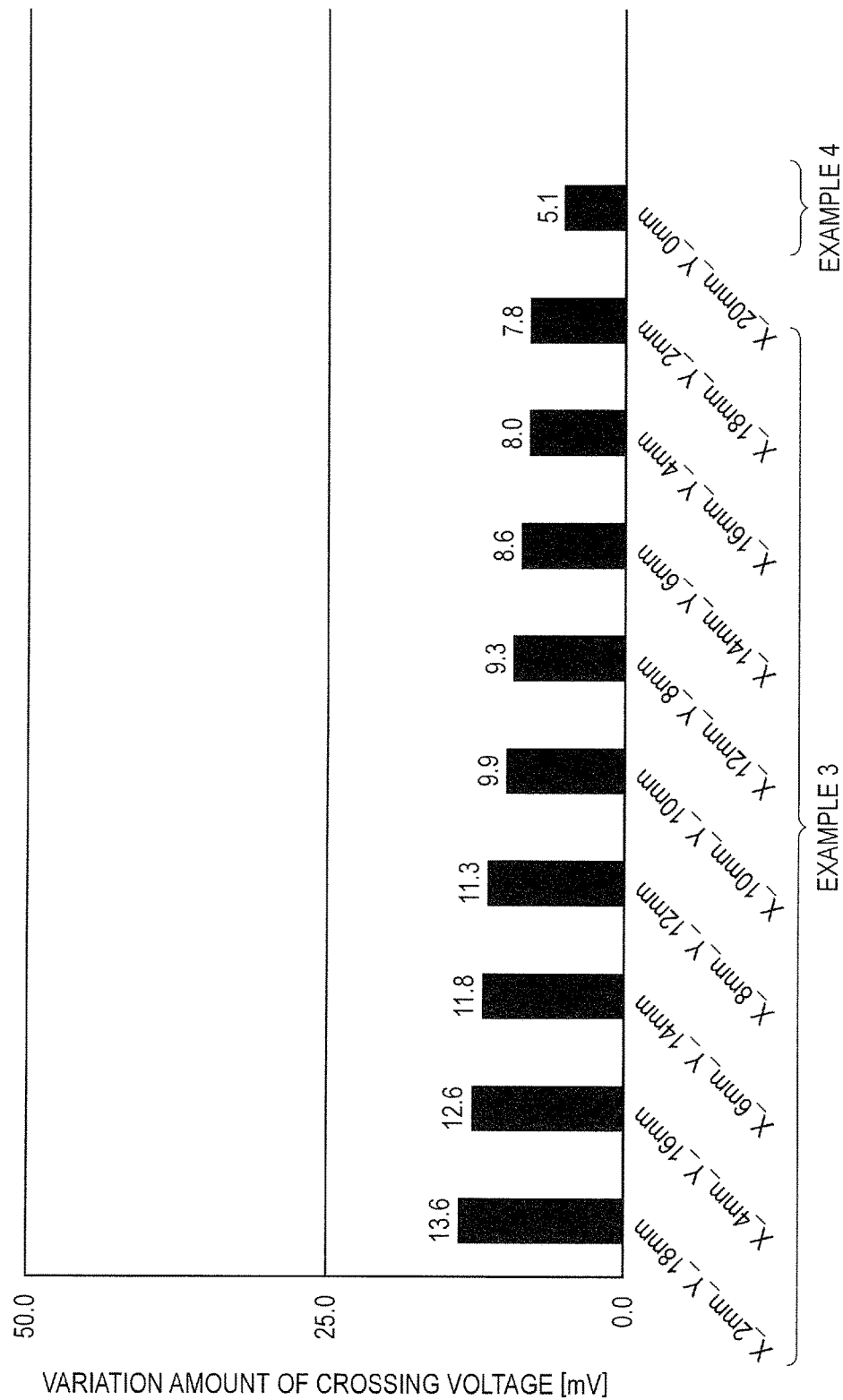

PRINTED CIRCUIT BOARD, PRINTED WIRING BOARD, AND DIFFERENTIAL TRANSMISSION CIRCUIT

TECHNICAL FIELD

The present invention relates to a printed circuit board, a printed wiring board, and a differential transmission circuit that include a plurality of differential signal line pairs each serving as transmission paths for a pair of differential signals.

BACKGROUND ART

In order to prevent a malfunction of a signal input unit for differential signals as used in a memory interface and the like, a permissible variation amount is defined for a voltage at which voltages of a positive signal and a negative signal of a pair of differential signals cross with each other (hereinafter referred to as "crossing voltage").

Even when the crossing voltage falls within the defined permissible range at a signal output unit, the slew rate or the phase may differ between the positive signal and the negative signal due to inter-wiring crosstalk generated on a printed wiring board or a wiring length difference between a positive signal line and a negative signal line. The different slew rate or phase may vary the crossing voltage, thus failing to satisfy the defined permissible range of the crossing voltage at the signal input unit. The variation in the crossing voltage generated on the printed wiring board therefore needs to be reduced as much as possible.

In view of the foregoing, in PTL 1, it is described that a ground line is arranged between two signal lines that may generate inter-wiring crosstalk. Particularly when differential signal lines formed of a pair of signal lines are arranged adjacent to other differential signal lines formed of another pair of signal lines, two signal lines of different differential signal line pairs are arranged adjacent to each other. Accordingly, in PTL 1, there is disclosed a flexible wiring board in which a ground line is arranged between one differential signal line pair and another differential signal line pair, to thereby prevent crosstalk therebetween.

The use of a high-density mounting component such as a ball grid array (BGA), which is frequently used in recent years, requires a great number of signal lines to be led out from component pads. Correspondingly, the number of lead-out differential signal lines is increasing, and the amount of crosstalk between the differential signal lines is also increasing. In the printed wiring board disclosed in PTL 1, however, because a ground line is arranged between two signal lines that may generate inter-wiring crosstalk, a great number of ground lines are required to be arranged, with the result that a wiring region is enlarged to hinder high densification and miniaturization of the printed wiring board. The degree of freedom in design of the printed wiring board is also reduced. In addition, because the slew rate and the wiring density are increasing due to high-speed signal propagation, the crosstalk voltage generated between differential signal lines across a ground line is increasing. Thus, in order to obtain a sufficient effect of reducing the variation amount of the crossing voltage, the width of a ground line arranged between two signal lines needs to be further increased.

It is therefore an object of the present invention to reduce a variation amount of a crossing voltage of a pair of differential signals input to a signal input unit.

CITATION LIST

Patent Literature

PTL 1: Japanese Patent Application Laid-Open No. 2006-041193

SUMMARY OF INVENTION

According to one embodiment of the present invention, there is provided a printed circuit board, including:
a first semiconductor device configured to input and output a signal;
a second semiconductor device configured to input and output a signal; and
a printed wiring board having the first semiconductor device and the second semiconductor device mounted thereon, the printed wiring board including:
a first differential signal wiring formed of a pair of signal transmission lines, the first differential signal wiring connecting the first semiconductor device and the second semiconductor device to each other; and
a second differential signal wiring formed of a pair of signal transmission lines, the second differential signal wiring connecting the first semiconductor device and the second semiconductor device to each other and being arranged in parallel to the first differential signal wiring,
in which the pair of signal transmission lines forming the first differential signal wiring are wired to have a relative arrangement in which, when viewed in plan from a direction perpendicular to a surface of the printed wiring board, one signal transmission line and another signal transmission line cross with each other at least once in the first differential signal wiring in a wiring direction thereof, and
in which the pair of signal transmission lines forming the second differential signal wiring are wired to have a relative arrangement in which, when viewed in plan from the direction perpendicular to the surface of the printed wiring board, one signal transmission line and another signal transmission line cross with each other at least once in the second differential signal wiring in a wiring direction thereof.

Further features of the present invention will become apparent from the following description of exemplary embodiments with reference to the attached drawings.

BRIEF DESCRIPTION OF DRAWINGS

FIG. 1 is a plan view for illustrating a printed circuit board according to a first embodiment of the present invention.

FIG. 11 is a graph for illustrating simulation results of a crossing voltage in Examples 3 and 4.

DESCRIPTION OF EMBODIMENTS

Figure 2A:
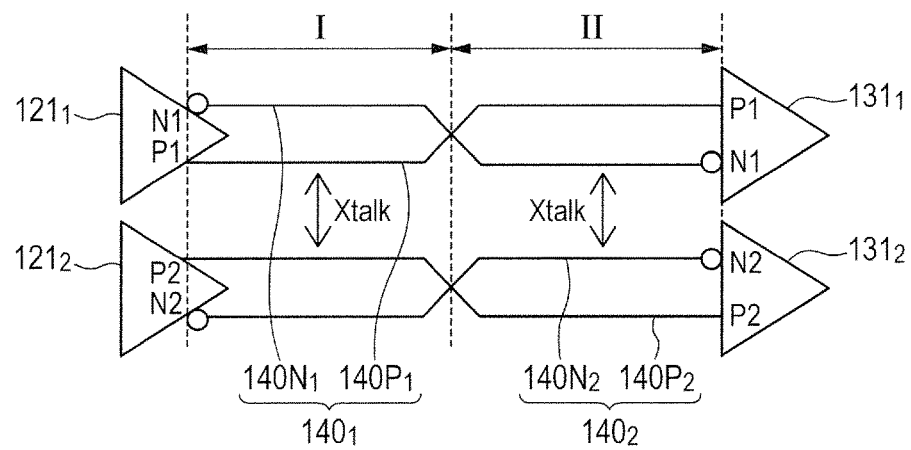
FIG. 2A is a diagram for illustrating a principle of the printed circuit board according to the first embodiment of the present invention.

Exemplary embodiments of the present invention are described below in detail with reference to the accompanying drawings.

First Embodiment

FIG. 1 is a plan view for illustrating a printed circuit board according to a first embodiment of the present invention. A printed circuit board 100 includes a printed wiring board 101, and an integrated circuit (IC) 111 and an IC 112 serving as a first semiconductor package (semiconductor device) and a second semiconductor package that are mounted on the printed wiring board 101. Note that, the printed wiring board refers to a printed board having no electronic components mounted thereon, and the printed circuit board refers to a printed board having electronic components mounted thereon.

The printed wiring board 101 is a multilayer (for example, four-layer) printed wiring board including a plurality of conductor layers each having a conductor pattern arranged thereon. One of the internal conductor layers is a power supply layer mainly having a power supply pattern (not shown) arranged thereon, and another one of the internal conductor layers is a ground layer mainly having a ground pattern (not shown) arranged thereon. The power supply pattern is a planar conductor to be applied with a power supply potential. The ground pattern is a planar conductor to be applied with a ground potential. The power supply pattern and the ground pattern, which are planar, have a wide area so that the power supply potential and the ground potential are stabilized. Note that, another conductor (such as a ground line or a signal line) than the conductor to be applied with the power supply potential may be arranged on the power supply layer. Further, another conductor (such as a power supply line or a signal line) than the conductor to be applied with the ground potential may be arranged on the ground layer.

A pair of surface layers (surfaces) 101A and 101B of the printed wiring board 101 are signal wiring layers (first signal wiring layer and second signal wiring layer) mainly having signal lines arranged thereon. Note that, another conductor (such as a ground line or a power supply line) than the conductor to be applied with signals may be arranged on the signal wiring layers.

The IC 111 is mounted on one of the pair of surface layers 101A and 101B, specifically, the surface layer 101A. The IC 112 is mounted on the other surface layer 101B.

In the first embodiment, the ground layer is arranged adjacent to the surface layer 101A serving as the first signal wiring layer through intermediation of an insulating layer, and the power supply layer is arranged adjacent to the surface layer 101B serving as the second signal wiring layer through intermediation of an insulating layer. In this manner, the four conductor layers of the first signal wiring layer, the ground layer, the power supply layer, and the second signal wiring layer are laminated through intermediation of the insulating layers to construct the four-layer printed wiring board 101.

The IC 111 includes a plurality of (two in the first embodiment) signal output circuits (signal output units, drivers) $121_1$ and $121_2$. Further, the IC 112 includes a plurality of (two in the first embodiment) signal input circuits (signal input units, receivers) $131_1$ and $131_2$.

The signal output circuit $121_1$ includes a pair of output terminals $121P_1$ and $121N_1$ configured to output a pair of differential signals (positive differential signal P1 and negative differential signal N1) P1 and N1. Specifically, the signal output circuit $121_1$ includes the output terminal $121P_1$ configured to output the differential signal P1 and the output terminal $121N_1$ configured to output the differential signal N1.

Similarly, the signal output circuit $121_2$ includes a pair of output terminals $121P_2$ and $121N_2$ configured to output a pair of differential signals (positive differential signal P2 and negative differential signal N2) P2 and N2. Specifically, the signal output circuit $121_2$ includes the output terminal $121P_2$ configured to output the differential signal P2 and the output terminal $121N_2$ configured to output the differential signal N2. Those plurality of signal output circuits $121_1$ and $121_2$ have the same circuit configuration.

The signal input circuit $131_1$ includes a pair of input terminals $131P_1$ and $131N_1$ configured to input the pair of differential signals P1 and N1. Specifically, the signal input circuit $131_1$ includes the input terminal $131P_1$ configured to input the differential signal P1 and the input terminal $131N_1$ configured to input the differential signal N1.

Similarly, the signal input circuit $131_2$ includes a pair of input terminals $131P_2$ and $131N_2$ configured to input the pair of differential signals P2 and N2. Specifically, the signal input circuit $131_2$ includes the input terminal $131P_2$ configured to input the differential signal P2 and the input terminal $131N_2$ configured to input the differential signal N2. Those plurality of signal input circuits $131_1$ and $131_2$ have the same circuit configuration.

The description in the first embodiment is given of the case where the plurality of signal output circuits $121_1$ and $121_2$ are packaged as a single semiconductor package, but the plurality of signal output circuits $121_1$ and $121_2$ may be formed as individual semiconductor packages. Similarly, the description in the first embodiment is given of the case where the plurality of signal input circuits $131_1$ and $131_2$ are packaged as a single semiconductor package, but the plurality of signal input circuits $131_1$ and $131_2$ may be formed as individual semiconductor packages.

A plurality of differential signal line pairs each serving as transmission paths for a pair of differential signals are formed on the printed wiring board 101 in parallel to each other. Ends of each differential signal line pair on one side in the wiring direction are connected to the pair of output terminals, and ends thereof on the other side in the wiring direction are connected to the pair of input terminals.

Specifically, a plurality of (two in the first embodiment) differential signal line pairs $140_1$ (first differential signal wiring) and $140_2$ (second differential signal wiring) are formed on the printed wiring board 101 in parallel to each other with an interval therebetween in a direction orthogonal to the wiring direction. The differential signal line pair $140_1$ includes a differential signal line $140P_1$ (second signal transmission line) serving as a transmission path for the positive differential signal P1 and a differential signal line 140N$_1$ (first signal transmission line) serving as a transmission path for the negative differential signal N1. The differential signal line pair 140$_2$ includes a differential signal line 140P$_2$ serving as a transmission path for the positive differential signal P2 and a differential signal line 140N$_2$ serving as a transmission path for the negative differential signal N2. The differential signal line 140P$_1$ and the differential signal line 140N$_1$ are arranged adjacent to each other. The differential signal line 140P$_2$ (third signal transmission line) and the differential signal line 140N$_2$ (fourth signal transmission line) are arranged adjacent to each other.

The differential signal line 140P$_1$ includes a land 141P$_1$, a signal pattern 142P$_1$ (third wiring pattern), a signal via 143P$_1$, a signal pattern 144P$_1$ (fourth wiring pattern), and a land 145P$_1$. The land 141P$_1$ is a conductor which is formed on the surface layer 101A and to which the output terminal 121P$_1$ is joined by solder or the like. The land 141P$_1$ corresponds to one end of the differential signal line 140P$_1$ in the wiring direction. The signal via 143P$_1$ is a conductor formed in a via hole (through hole) formed in the printed wiring board 101. The signal pattern 142P$_1$ is a conductor formed on the surface layer 101A, and electrically connects the land 141P$_1$ and the signal via 143P$_1$ to each other. The land 145P$_1$ is a conductor which is formed on the surface layer 101B and to which the input terminal 131P$_1$ is joined by solder or the like. The land 145P$_1$ corresponds to the other end of the differential signal line 140P$_1$ in the wiring direction. The signal pattern 144P$_1$ is a conductor formed on the surface layer 101B, and electrically connects the land 145P$_1$ and the signal via 143P$_1$ to each other.

The differential signal line 140N$_1$ includes a land 141N$_1$, a signal pattern 142N$_1$ (first wiring pattern), a signal via 143N$_1$, a signal pattern 144N$_1$ (second wiring pattern), and a land 145N$_1$. The land 141N$_1$ is a conductor which is formed on the surface layer 101A and to which the output terminal 121N$_1$ is joined by solder or the like. The land 141N$_1$ corresponds to one end of the differential signal line 140N$_1$ in the wiring direction. The signal via 143N$_1$ is a conductor formed in a via hole (through hole) formed in the printed wiring board 101. The signal pattern 142N$_1$ is a conductor formed on the surface layer 101A, and electrically connects the land 141N$_1$ and the signal via 143N$_1$ to each other. The land 145N$_1$ is a conductor formed on the surface layer 101B and to which the input terminal 131N$_1$ is joined by solder or the like. The land 145N$_1$ corresponds to the other end of the differential signal line 140N$_1$ in the wiring direction. The signal pattern 144N$_1$ is a conductor formed on the surface layer 101B, and electrically connects the land 145N$_1$ and the signal via 143N$_1$ to each other.

The differential signal line 140P$_2$ includes a land 141P$_2$, a signal pattern 142P$_2$ (fifth wiring pattern), a signal via 143P$_2$, a signal pattern 144P$_2$ (sixth wiring pattern), and a land 145P$_2$. The land 141P$_2$ is a conductor which is formed on the surface layer 101A and to which the output terminal 121P$_2$ is joined by solder or the like. The land 141P$_2$ corresponds to one end of the differential signal line 140P$_2$ in the wiring direction. The signal via 143P$_2$ is a conductor formed in a via hole (through hole) formed in the printed wiring board 101. The signal pattern 142P$_2$ is a conductor formed on the surface layer 101A, and electrically connects the land 141P$_2$ and the signal via 143P$_2$ to each other. The land 145P$_2$ is a conductor which is formed on the surface layer 101B and to which the input terminal 131P$_2$ is joined by solder or the like. The land 145P$_2$ corresponds to the other end of the differential signal line 140P$_2$ in the wiring direction. The signal pattern 144P$_2$ is a conductor formed on the surface layer 101B, and electrically connects the land 145P$_2$ and the signal via 143P$_2$ to each other.

The differential signal line 140N$_2$ includes a land 141N$_2$, a signal pattern 142N$_2$ (seventh wiring pattern), a signal via 143N$_2$, a signal pattern 144N$_2$ (eighth wiring pattern), and a land 145N$_2$. The land 141N$_2$ is a conductor which is formed on the surface layer 101A and to which the output terminal 121N$_2$ is joined by solder or the like. The land 141N$_2$ corresponds to one end of the differential signal line 140N$_2$ in the wiring direction. The signal via 143N$_2$ is a conductor formed in a via hole (through hole) formed in the printed wiring board 101. The signal pattern 142N$_2$ is a conductor formed on the surface layer 101A, and electrically connects the land 141N$_2$ and the signal via 143N$_2$ to each other. The land 145N$_2$ is a conductor which is formed on the surface layer 101B and to which the input terminal 131N$_2$ is joined by solder or the like. The land 145N$_2$ corresponds to the other end of the differential signal line 140N$_2$ in the wiring direction. The signal pattern 144N$_2$ is a conductor formed on the surface layer 101B, and electrically connects the land 145N$_2$ and the signal via 143N$_2$ to each other.

As described above, the differential signal lines 140P$_1$, 140N$_1$, 140P$_2$, and 140N$_2$ in the two adjacent differential signal line pairs 140$_1$ and 140$_2$ are wired on the surface layer 101A, which is a first layer, and the surface layer 101B, which is a second layer different from the first layer, through the signal vias.

The two differential signal line pairs 140$_1$ and 140$_2$ are arranged adjacent to each other. In the first embodiment, other conductors such as ground lines and power supply lines are not interposed between the adjacent two differential signal line pairs 140$_1$ and 140$_2$.

Similarly, other conductors such as ground lines and power supply lines are not interposed between the adjacent differential signal line 140P$_1$ and differential signal line 140N$_1$ and between the adjacent differential signal line 140P$_2$ and differential signal line 140N$_2$.

In the first embodiment, the differential signal line pair 140$_1$ (140$_2$) is wired to have a relative arrangement in which one differential signal line 140P$_1$ (140P$_2$) and the other differential signal line 140N$_1$ (140N$_2$) cross with each other in the middle of the differential signal line pair 140$_1$ (140$_2$) in the wiring direction. Specifically, the positive and negative signal lines in the differential signal line pair 140$_1$ cross with each other at the signal vias 143P$_1$ and 143N$_1$ forming a crossing region, and the positive and negative signal lines in the differential signal line pair 140$_2$ cross with each other at the signal vias 143P$_2$ and 143N$_2$ forming a crossing region.

Specifically, the signal patterns on the side close to the signal output circuits 121$_1$ and 121$_2$ are arranged in the order of the negative signal pattern 142N$_1$, the positive signal pattern 142P$_1$, the positive signal pattern 142P$_2$, and the negative signal pattern 142N$_2$. Further, the signal patterns on the side close to the signal input circuits 131$_1$ and 131$_2$ are arranged in the order of the positive signal pattern 144P$_1$, the negative signal pattern 144N$_1$, the negative signal pattern 144N$_2$, and the positive signal pattern 144P$_2$.

In other words, on the side close to the signal output circuits 121$_1$ and 121$_2$, the positive signal line 140P$_1$ in the differential signal line pair 140$_1$ and the positive signal line 140P$_2$ in the differential signal line pair 140$_2$ are opposed to each other. Further, on the side close to the signal input circuits 131$_1$ and 131$_2$, the negative signal line 140N$_1$ in the differential signal line pair 140$_1$ and the negative signal line 140N$_2$ in the differential signal line pair 140$_2$ are opposed to each other.

In this manner, in the first embodiment, in the differential signal line pairs $140_1$ and $140_2$, the signal vias $143P_1$ and $143N_1$ and the signal vias $143P_2$ and $143N_2$ each serve as the region in which the differential signal lines have the relative arrangement of crossing with each other in the direction orthogonal to the wiring direction. Specifically, the differential signal line pair $140_1$ ($140_2$) is wired to have a relative arrangement in which one differential signal line $140P_1$ ($140P_2$) and the other differential signal line $140N_1$ ($140N_2$) cross with each other through the surface layer 101A and the surface layer 101B.

In the configuration of the first embodiment, crosstalk is superimposed from the signal pattern $142P_1$ of the positive signal line $140P_1$ in the differential signal line pair $140_1$ to the signal pattern $142P_2$ of the positive signal line $140P_2$ in the differential signal line pair $140_2$. On the other hand, crosstalk in antiphase to that of the positive signal lines is superimposed from the signal pattern $144N_1$ of the negative signal line $140N_1$ in the differential signal line pair $140_1$ to the signal pattern $144N_2$ of the negative signal line $140N_2$ in the differential signal line pair $140_2$.

Similarly, crosstalk is superimposed from the signal pattern $142P_2$ of the positive signal line $140P_2$ in the differential signal line pair $140_2$ to the signal pattern $142P_1$ of the positive signal line $140P_1$ in the differential signal line pair $140_1$. On the other hand, crosstalk in antiphase to that of the positive signal lines is superimposed from the signal pattern $144N_2$ of the negative signal line $140N_2$ in the differential signal line pair $140_2$ to the signal pattern $144N_1$ of the negative signal line $140N_1$ in the differential signal line pair $140_1$.

In this manner, at the input terminals $131P_1$, $131N_1$, $131P_2$, and $131N_2$ of the respective signal input circuits $131_1$ and $131_2$, variation amounts of the slew rates of the positive signal and the negative signal caused by the crosstalk are approximated to each other. Consequently, a variation amount of a crossing voltage of the differential signals P1 and N1 (P2 and N2) is reduced.

Further, in the adjacent two differential signal line pairs $140_1$ and $140_2$ among the plurality of differential signal line pairs, the regions in which the differential signal lines cross with each other are formed line-symmetrically to the center line $C_1$ passing along the wiring direction between the two differential signal line pairs $140_1$ and $140_2$.

In the first embodiment, the regions in which the differential signal lines cross with each other correspond to the signal vias $143P_1$ and $143N_1$ and the signal vias $143P_2$ and $143N_2$. Thus, the signal vias $143P_1$ and $143N_1$ and the signal vias $143P_2$ and $143N_2$ are arranged line-symmetrically to the center line $C_1$. This line-symmetric configuration enables the phase of the crosstalk superimposed between the signal pattern $142P_1$ and the signal pattern $142P_2$ and the phase of the crosstalk superimposed between the signal pattern $144N_1$ and the signal pattern $144N_2$ to effectively match with each other. Consequently, the variation amount of the crossing voltage of the differential signals is effectively reduced.

In addition, in the first embodiment, the differential signal line pair $140_1$ and the differential signal line pair $140_2$ are arranged line-symmetrically to the center line $C_1$. This line-symmetric configuration enables the phase of the crosstalk superimposed between the signal pattern $142P_1$ and the signal pattern $142P_2$ and the phase of the crosstalk superimposed between the signal pattern $144N_1$ and the signal pattern $144N_2$ to further effectively match with each other. Consequently, the variation amount of the crossing voltage of the differential signals is further effectively reduced.

Further, as illustrated in FIG. 1, it is preferred that the signal vias $143P_1$ and $143N_1$ and the signal vias $143P_2$ and $143N_2$ be arranged on the outer side of the two differential signal line pairs $140_1$ and $140_2$ so as not to be adjacent to each other for the purpose of reducing the crosstalk.

Further, in the first embodiment, the adjacent two differential signal line pairs $140_1$ and $140_2$ are wired so that signals in phase are transmitted through respective wiring portions that are arranged adjacent to each other between the differential signal line pair $140_1$ and the differential signal line pair $140_2$. In this case, the signal pattern $142P_1$ and the signal pattern $142P_2$ correspond to the wiring portions arranged adjacent to each other, and the signal pattern $144N_1$ and the signal pattern $144N_2$ correspond to the wiring portions arranged adjacent to each other.

When the differential signals propagating through the respective wiring portions (signal pattern $142P_1$ and signal pattern $142P_2$, and signal pattern $144N_1$ and signal pattern $144N_2$) arranged adjacent to each other are in phase, the electric fields are strongly coupled between the respective wiring portions arranged adjacent to each other, to thereby reduce the variation amount of the crossing voltage. On the other hand, when the signals propagating through the respective wiring portions arranged adjacent to each other are in antiphase, the magnetic fields are strongly coupled between the respective wiring portions arranged adjacent to each other, to thereby reduce the variation amount of the crossing voltage.

The direction of the generated crosstalk (positive and negative of voltage) with respect to the direction of the signals differs depending on output impedance, the board, and termination conditions. Specifically, when the signals flowing through the respective wiring portions arranged adjacent to each other are in the same direction, the crosstalk generated from one of the adjacent wiring portions shortens the rise/fall time of the signal flowing through the other wiring portion. Further, the opening of the eye pattern can be improved in addition to the improvement in variation in the crossing voltage. On the other hand, when the signals flowing through the respective wiring portions arranged adjacent to each other are in opposite directions, the crosstalk generated from one of the adjacent wiring portions lengthens the rise/fall time of the signal flowing through the other wiring portion. Further, overshoot and undershoot can be suppressed in addition to the improvement in variation in the crossing voltage.

In practice, it is preferred to select whether the crosstalks received by the adjacent differential signal line pairs are set to be in phase or in antiphase in consideration of design constraints (which of the opening of the eye pattern and the overshoot/undershoot is given priority).

Note that, even when the signal vias $143P_1$ and $143N_1$ and the signal vias $143P_2$ and $143N_2$ are not arranged line-symmetrically, the variation in the crossing voltage can be reduced because crosstalks in antiphase to each other are partially superimposed between the positive and negative sides. Further, even when the signal vias $143P_1$ and $143N_1$ and the signal vias $143P_2$ and $143N_2$ are arranged adjacent to each other, the influence of the variation in the crossing voltage is small because the crosstalk between the signal patterns is larger than the crosstalk between the signal vias in a general printed wiring board.

Further, the signal vias $143P_1$ and $143N_1$ and the signal vias $143P_2$ and $143N_2$ are arranged in the vicinity of the center between the IC 111 and the IC 112, but the arrangement is not limited thereto. Even when the signal vias $143P_1$ and $143N_1$ and the signal vias $143P_2$ and $143N_2$ are not arranged in the vicinity of the center between the IC 111 and the IC 112, the variation in the crossing voltage can be reduced because crosstalks in antiphase to each other are partially superimposed between the positive wiring and the negative wiring.

Figure 2B:
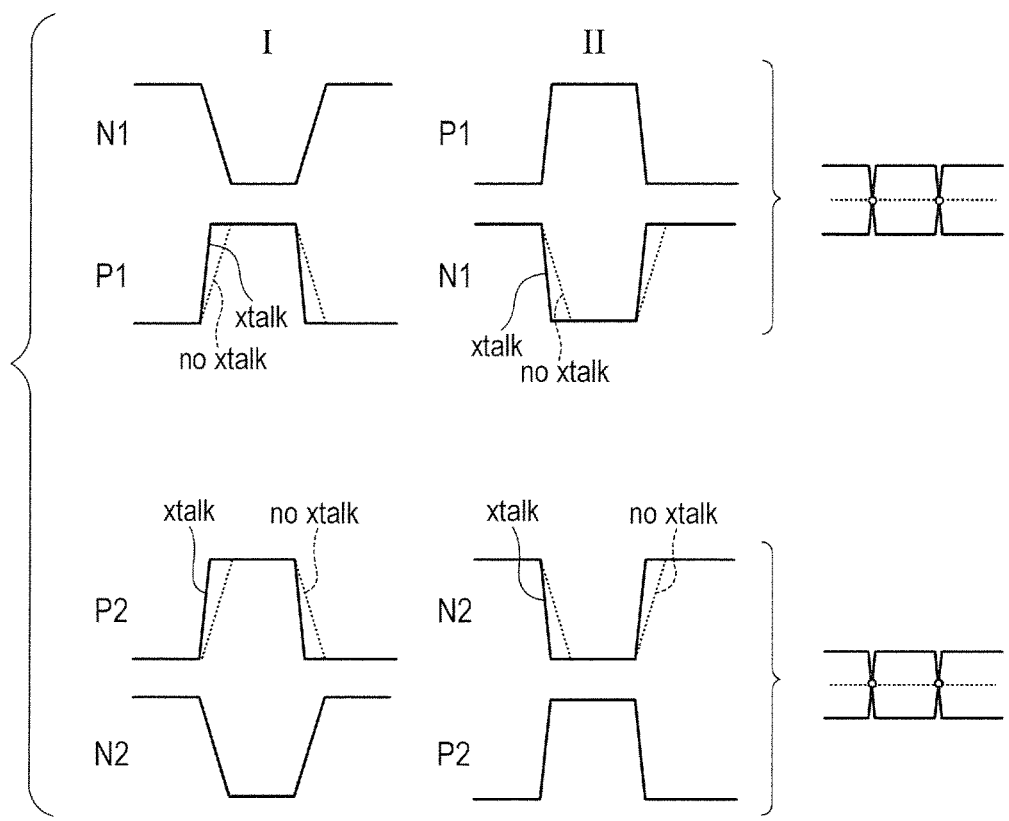
FIG. 2B is a diagram for illustrating a principle of the printed circuit board according to the first embodiment of the present invention.

FIG. 2A and FIG. 2B are diagrams for illustrating the principle of the printed circuit board 100 according to the first embodiment of the present invention. FIG. 2A is a schematic diagram of the wiring structure of the printed circuit board 100, and FIG. 2B is a waveform diagram of the signals P1, N1, P2, and N2. Note that, in FIG. 2B, the solid line represents the case where crosstalk is generated (xtalk), and the dotted line represents the case where no crosstalk is generated (no xtalk).

The two differential signal line pairs 140$_1$ and 140$_2$ are arranged adjacent to each other between the signal output circuits 121$_1$ and 121$_2$ and the signal input circuits 131$_1$ and 131$_2$. The order of the positive and negative signal lines is changed between the section I from the signal output circuits 121$_1$ and 121$_2$ to the wiring rearranging portion (signal vias) and the section II from the wiring rearranging portion to the signal input circuits 131$_1$ and 131$_2$. In other words, FIG. 2A is a schematic illustration of how the wiring is rearranged in the middle of the path.

In FIG. 2A, the differential signal lines 140$_1$ and 140$_2$ in the section I are arranged in the order of the negative signal line 140N$_1$, the positive signal line 140P$_1$, the positive signal line 140P$_2$, and the negative signal line 140N$_2$. The differential signal lines 140$_1$ and 140$_2$ in the section II are arranged in the order of the positive signal line 140P$_1$, the negative signal line 140N$_1$, the negative signal line 140N$_2$, and the positive signal line 140P$_2$.

Crosstalk in the above-mentioned transmission paths is now considered. In the section I, the positive signal line 140P$_1$ and the positive signal line 140P$_2$ are arranged adjacent to each other, and hence as illustrated in FIG. 2B, the waveforms of the two signal lines are changed mainly due to the crosstalk. The differential signals propagating through the signal lines 140P$_1$ and 140P$_2$ are in phase, and hence common-mode crosstalk is superimposed on each of the positive signal line 140P$_1$ and the positive signal line 140P$_2$.

On the other hand, in the section II, the negative signal line 140N$_1$ and the negative signal line 140N$_2$ are arranged adjacent to each other, and hence as illustrated in FIG. 2B, the waveforms of the two signal lines are changed mainly due to the crosstalk. The differential signals propagating through the signal lines 140N$_1$ and 140N$_2$ are in phase, and hence common-mode crosstalk is superimposed on each of the negative signal line 140N$_1$ and the negative signal line 140N$_2$.

In other words, the slew rate of the positive signal line 140P$_1$ of the differential signal line 140$_1$ varies due to the common-mode crosstalk. The slew rate of the negative signal line 140N$_1$ varies due to the common-mode crosstalk in antiphase to the crosstalk received by the signal line 140P$_1$.

Similarly, the slew rate of the positive signal line 140P$_2$ of the differential signal line 140$_2$ varies due to the common-mode crosstalk. The slew rate of the negative signal line 140N$_2$ varies due to the common-mode crosstalk in antiphase to the crosstalk received by the signal line 140P$_2$.

In this manner, the slew rates of the positive signal and the negative signal are approximated to each other at the input terminals of the respective signal input circuits 131$_1$ and 131$_2$ for the two pairs of differential signals, to thereby reduce the variation amount of the crossing voltage of the differential signals.

In addition, the two differential signal line pairs 140$_1$ and 140$_2$ are wired so that the wiring length of the respective wiring portions arranged adjacent to each other in the section I in the wiring direction and the wiring length of the respective wiring portions arranged adjacent to each other in the section II in the wiring direction are substantially equal to each other.

Specifically, the wiring length of the signal pattern 142P$_1$ (142P$_2$) and the wiring length of the signal pattern 144N$_1$ (144N$_2$) are substantially equal to each other. Further, in the first embodiment, the wiring length of the signal pattern 142P$_1$ and the wiring length of the signal pattern 142P$_2$ are substantially equal to each other, and the wiring length of the signal pattern 144N$_1$ and the wiring length of the signal pattern 144N$_2$ are substantially equal to each other. Note that, "wiring lengths substantially equal to each other" as used in the present invention refer to the wiring lengths with a difference of 3 mm or less. However, the wiring length difference depends on the frequency of signals to be transmitted.

With the configuration described above, the crosstalk superimposed between the positive signal lines 140P$_1$ and 140P$_2$ and the crosstalk superimposed between the negative signal lines 140N$_1$ and 140N$_2$ of the respective differential signal line 140$_1$ and differential signal line 140$_2$ are in antiphase and equal in amount. Consequently, the slew rates of the positive signal and the negative signal vary due to the crosstalk by the same amount, and hence the variation amount of the crossing voltage of the pair of differential signals is further reduced.

Now, the rise/fall time of the differential signal line 140P$_1$ is represented by Trf$_{P1}$. An output phase difference of the pair of differential signals P2 with respect to the pair of differential signals P1 is represented by $\delta_{P2,P1}$. Further, a wiring length difference of the differential signal line 140P$_2$ with respect to the differential signal line 140P$_1$ is represented by $\Delta l_{140P2,140P1}$, a wiring length difference of the differential signal line 140N$_2$ with respect to the differential signal line 140P$_1$ is represented by $\Delta l_{140N2,140P1}$, and an effective relative permittivity of the differential signal line with respect to an insulator around the differential signal line is represented by $\varepsilon_S$. In this case, it is preferred that the following mathematical expression be satisfied in order to sufficiently exhibit the effect of reducing the variation amount of the crossing voltage (c represents the speed of light). Note that, the same applies for the rise/fall time of the differential signal lines 140N$_1$, 140P$_2$, and 140N$_2$.

$$Trf_{P1} \geq \text{Max}\left( \delta_{P2,P1} + \Delta l_{140P2,140P1} \times \frac{\sqrt{\varepsilon_s}}{c}, \right. \quad \text{[Math. 1]}$$

$$\left. \delta_{N2,P1} + \Delta l_{140N2,140P1} \times \frac{\sqrt{\varepsilon_s}}{c} \right)$$

Further, the effect of reducing the variation amount of the crossing voltage becomes remarkable in the configuration illustrated in FIG. 1 when crosstalk is superimposed with such a wiring length that needs consideration as a distributed constant line. The length of the signal pattern 142P$_1$ of the differential signal line 140P$_1$ (length in the section I) is represented by $L_{142P1}$. Further, the length of the signal pattern 144P$_1$ of the differential signal line 140P$_1$ (length in the section II) is represented by $L_{144P1}$. In this case, it is preferred that the following mathematical expression be satisfied in order to sufficiently exhibit the effect of reducing the variation amount of the crossing voltage. Note that, the same applies for the signal patterns $142N_1$, $142P_2$, $142N_2$, $144N_1$, $144P_2$, and $144N_2$. Further, in order to avoid the influence of signal reflection, it is preferred to match the impedance of the signal output circuit 121, the signal input circuit 131, the wiring patterns 142P, 142N, 144P, and 144N, and the signal vias 143P and 143N serving as the wiring rearranging portions.

$$Trf_{P1} \leq \min\left(\frac{2L_{142P1}\sqrt{\varepsilon_s}}{c}, \frac{2L_{144P1}\sqrt{\varepsilon_s}}{c}\right) \quad \text{[Math. 2]}$$

In the first embodiment, the printed wiring board 101 having a four-layer structure is exemplified, but the number of layers is not limited to four. Further, other kinds of wiring than the signal lines, such as ground lines, may be interposed between the signal pattern $142P_1$ and the signal pattern $142P_2$ and between the signal pattern $144N_1$ and the signal pattern $144N_2$.

Further, the differential signals propagating through the respective wiring portions (signal pattern $142P_1$ and signal pattern $142P_2$, and signal pattern $144N_1$ and signal pattern $144N_2$) arranged adjacent to each other may not be in phase, and even when the differential signals are in antiphase or are random pulses, the effect of reducing the variation amount of the crossing voltage is exhibited. Thus, the order of arrangement of the positive and negative wirings in the differential signal line pairs $140_1$ and $140_2$ is not limited to the one described in the first embodiment, and any combinations of the wirings are possible.

Further, the description in the first embodiment has been given of the case where the printed wiring board 101 includes the two differential signal line pairs $140_1$ and $140_2$, but the present invention is not limited thereto. The present invention is also applicable to the case where the printed wiring board 101 includes three or more differential signal line pairs. In this case, it is only necessary that two adjacent differential signal line pairs among the plurality of differential signal line pairs be arranged as described in the first embodiment so that each differential signal line pair is wired to have a relative arrangement in which one signal line and the other signal line cross with each other in the middle in the wiring direction.

Second Embodiment

Figure 3:
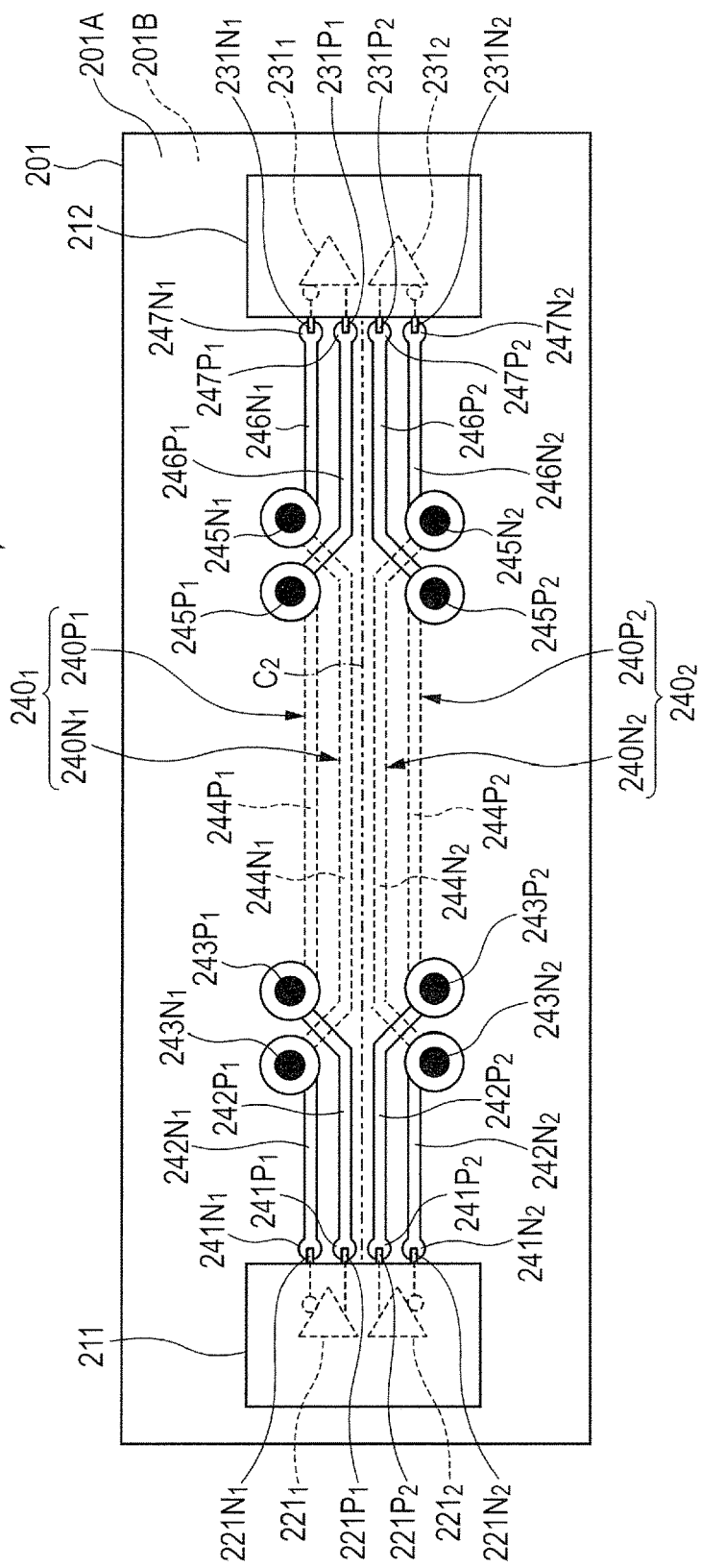
FIG. 3 is a plan view for illustrating a printed circuit board according to a second embodiment of the present invention.

Next, a printed circuit board according to a second embodiment of the present invention is described. FIG. 3 is a plan view for illustrating the printed circuit board according to the second embodiment of the present invention. A printed circuit board 200 illustrated in FIG. 3 includes a printed wiring board 201, and an IC 211 and an IC 212 serving as a first semiconductor package and a second semiconductor package that are mounted on the printed wiring board 201.

The printed wiring board 201 is a multilayer (for example, four-layer) printed wiring board including a plurality of conductor layers each having a conductor pattern arranged thereon. One of the internal conductor layers is a power supply layer mainly having a power supply pattern (not shown) arranged thereon, and another one of the internal conductor layers is a ground layer mainly having a ground pattern (not shown) arranged thereon. The power supply pattern is a planar conductor to be applied with a power supply potential. The ground pattern is a planar conductor to be applied with a ground potential. Note that, another conductor (such as a ground line or a signal line) than the conductor to be applied with the power supply potential may be arranged on the power supply layer. Further, another conductor (such as a power supply line or a signal line) than the conductor to be applied with the ground potential may be arranged on the ground layer.

A pair of surface layers (surfaces) 201A and 201B of the printed wiring board 201 are signal wiring layers (first signal wiring layer and second signal wiring layer) mainly having signal lines arranged thereon. Note that, another conductor (such as a ground line or a power supply line) than the conductor to be applied with signals may be arranged on the signal wiring layers.

The IC 211 and the IC 212 are mounted on one of the pair of surface layers 201A and 201B, specifically, the surface layer 201A. The IC 211 and the IC 212 are mounted on the same surface layer 201A.

In the second embodiment, the ground layer is arranged adjacent to the surface layer 201A serving as the first signal wiring layer through intermediation of an insulating layer, and the power supply layer is arranged adjacent to the surface layer 201B serving as the second signal wiring layer through intermediation of an insulating layer. In this manner, the four conductor layers of the first signal wiring layer, the ground layer, the power supply layer, and the second signal wiring layer are laminated through intermediation of the insulating layers to construct the four-layer printed wiring board 201.

The IC 211 includes a plurality of (two in the second embodiment) signal output circuits (signal output units, drivers) $221_1$ and $221_2$. Further, the IC 212 includes a plurality of (two in the second embodiment) signal input circuits (signal input units, receivers) $231_1$ and $231_2$.

The signal output circuit $221_1$ includes a pair of output terminals $221P_1$ and $221N_1$ configured to output a pair of differential signals (positive differential signal P1 and negative differential signal N1) P1 and N1. Specifically, the signal output circuit $221_1$ includes the output terminal $221P_1$ configured to output the differential signal P1 and the output terminal $221N_1$ configured to output the differential signal N1.

Similarly, the signal output circuit $221_2$ includes a pair of output terminals $221P_2$ and $221N_2$ configured to output a pair of differential signals (positive differential signal P2 and negative differential signal N2) P2 and N2. Specifically, the signal output circuit $221_2$ includes the output terminal $221P_2$ configured to output the differential signal P2 and the output terminal $221N_2$ configured to output the differential signal N2. Those plurality of signal output circuits $221_1$ and $221_2$ have the same circuit configuration.

The signal input circuit $231_1$ includes a pair of input terminals $231P_1$ and $231N_1$ configured to input the pair of differential signals P1 and N1. Specifically, the signal input circuit $231_1$ includes the input terminal $231P_1$ configured to input the differential signal P1 and the input terminal $231N_1$ configured to input the differential signal N1.

Similarly, the signal input circuit $231_2$ includes a pair of input terminals $231P_2$ and $231N_2$ configured to input the pair of differential signals P2 and N2. Specifically, the signal input circuit $231_2$ includes the input terminal $231P_2$ configured to input the differential signal P2 and the input terminal $231N_2$ configured to input the differential signal N2. Those plurality of signal input circuits $231_1$ and $231_2$ have the same circuit configuration.

The description in the second embodiment is given of the case where the plurality of signal output circuits $221_1$ and $221_2$ are packaged as a single semiconductor package, but the plurality of signal output circuits $221_1$ and $221_2$ may be formed as individual semiconductor packages. Similarly, the description in the second embodiment is given of the case where the plurality of signal input circuits $231_1$ and $231_2$ are packaged as a single semiconductor package, but the plurality of signal input circuits $231_1$ and $231_2$ may be formed as individual semiconductor packages.

A plurality of differential signal line pairs each serving as transmission paths for a pair of differential signals are formed on the printed wiring board 201 in parallel to each other. Ends of each differential signal line pair on one side in the wiring direction are connected to the pair of output terminals, and ends thereof on the other side in the wiring direction are connected to the pair of input terminals.

Specifically, a plurality of (two in the second embodiment) differential signal line pairs $240_1$ (first differential signal wiring) and $240_2$ (second differential signal wiring) are formed on the printed wiring board 201 in parallel to each other with an interval therebetween in a direction orthogonal to the wiring direction. The differential signal line pair $240_1$ includes a differential signal line $240P_1$ (second signal transmission line) serving as a transmission path for the positive differential signal P1 and a differential signal line $240N_1$ (first signal transmission line) serving as a transmission path for the negative differential signal N1. The differential signal line pair $240_2$ includes a differential signal line $240P_2$ serving as a transmission path for the positive differential signal P2 and a differential signal line $240N_2$ serving as a transmission path for the negative differential signal N2. The differential signal line $240P_1$ and the differential signal line $240N_1$ are arranged adjacent to each other. The differential signal line $240P_2$ and the differential signal line $240N_2$ are arranged adjacent to each other.

The differential signal line $240P_1$ includes a land $241P_1$, a signal pattern $242P_1$ (fourth wiring pattern), a signal via $243P_1$, a signal pattern $244P_1$ (fifth wiring pattern), a signal via $245P_1$, a signal pattern $246P_1$ (sixth wiring pattern), and a land $247P_1$. The land $241P_1$ is a conductor which is formed on the surface layer 201A and to which the output terminal $221P_1$ is joined by solder or the like. The land $241P_1$ corresponds to one end of the differential signal line $240P_1$ in the wiring direction. The land $247P_1$ is a conductor which is formed on the surface layer 201A and to which the input terminal $231P_1$ is joined by solder or the like. The land $247P_1$ corresponds to the other end of the differential signal line $240P_1$ in the wiring direction. The signal vias $243P_1$ and $245P_1$ are conductors formed in via holes (through holes) formed in the printed wiring board 201. The signal pattern $242P_1$ is a conductor formed on the surface layer 201A, and electrically connects the land $241P_1$ and the signal via $243P_1$ to each other. The signal pattern $244P_1$ is a conductor formed on the surface layer 201B, and electrically connects the signal via $243P_1$ and the signal via $245P_1$ to each other. The signal pattern $246P_1$ is a conductor formed on the surface layer 201A, and electrically connects the signal via $245P_1$ and the land $247P_1$ to each other.

The differential signal line $240N_1$ includes a land $241N_1$, a signal pattern $242N_1$ (first wiring pattern), a signal via $243N_1$, a signal pattern $244N_1$ (second wiring pattern), a signal via $245N_1$, a signal pattern $246N_1$ (third wiring pattern), and a land $247N_1$. The land $241N_1$ is a conductor which is formed on the surface layer 201A and to which the output terminal $221N_1$ is joined by solder or the like. The land $241N_1$ corresponds to one end of the differential signal line $240N_1$ in the wiring direction. The land $247N_1$ is a conductor formed on the surface layer 201A and to which the input terminal $231N_1$ is joined by solder or the like. The land $247N_1$ corresponds to the other end of the differential signal line $240N_1$ in the wiring direction. The signal vias $243N_1$ and $245N_1$ are conductors formed in via holes (through holes) formed in the printed wiring board 201. The signal pattern $242N_1$ is a conductor formed on the surface layer 201A, and electrically connects the land $241N_1$ and the signal via $243N_1$ to each other. The signal pattern $244N_1$ is a conductor formed on the surface layer 201B, and electrically connects the signal via $243N_1$ and the signal via $245N_1$ to each other. The signal pattern $246N_1$ is a conductor formed on the surface layer 201A, and electrically connects the signal via $245N_1$ and the land $247N_1$ to each other.

The differential signal line $240P_2$ includes a land $241P_2$, a signal pattern $242P_2$ (seventh wiring pattern), a signal via $243P_2$, a signal pattern $244P_2$ (eighth wiring pattern), a signal via $245P_2$, a signal pattern $246P_2$ (ninth wiring pattern), and a land $247P_2$. The land $241P_2$ is a conductor which is formed on the surface layer 201A and to which the output terminal $221P_2$ is joined by solder or the like. The land $241P_2$ corresponds to one end of the differential signal line $240P_2$ in the wiring direction. The land $247P_2$ is a conductor which is formed on the surface layer 201A and to which the input terminal $231P_2$ is joined by solder or the like. The land $247P_2$ corresponds to the other end of the differential signal line $240P_2$ in the wiring direction. The signal vias $243P_2$ and $245P_2$ are conductors formed in via holes (through holes) formed in the printed wiring board 201. The signal pattern $242P_2$ is a conductor formed on the surface layer 201A, and electrically connects the land $241P_2$ and the signal via $243P_2$ to each other. The signal pattern $244P_2$ is a conductor formed on the surface layer 201B, and electrically connects the signal via $243P_2$ and the signal via $245P_2$ to each other. The signal pattern $246P_2$ is a conductor formed on the surface layer 201A, and electrically connects the signal via $245P_2$ and the land $247P_2$ to each other.

The differential signal line $240N_2$ includes a land $241N_2$, a signal pattern $242N_2$ (tenth wiring pattern), a signal via $243N_2$, a signal pattern $244N_2$ (eleventh wiring pattern), a signal via $245N_2$, a signal pattern $246N_2$ (twelfth wiring pattern), and a land $247N_2$. The land $241N_2$ is a conductor which is formed on the surface layer 201A and to which the output terminal $221N_2$ is joined by solder or the like. The land $241N_2$ corresponds to one end of the differential signal line $240N_2$ in the wiring direction. The land $247N_2$ is a conductor formed on the surface layer 201A and to which the input terminal $231N_2$ is joined by solder or the like. The land $247N_2$ corresponds to the other end of the differential signal line $240N_2$ in the wiring direction. The signal vias $243N_2$ and $245N_2$ are conductors formed in via holes (through holes) formed in the printed wiring board 201. The signal pattern $242N_2$ is a conductor formed on the surface layer 201A, and electrically connects the land $241N_2$ and the signal via $243N_2$ to each other. The signal pattern $244N_2$ is a conductor formed on the surface layer 201B, and electrically connects the signal via $243N_2$ and the signal via $245N_2$ to each other. The signal pattern $246N_2$ is a conductor formed on the surface layer 201A, and electrically connects the signal via $245N_2$ and the land $247N_2$ to each other.

As described above, the differential signal lines $240P_1$, $240N_1$, $240P_2$, and $240N_2$ in the two adjacent differential signal line pairs $240_1$ and $240_2$ are wired on the surface layer 201A, which is a first layer, and the surface layer 201B, which is a second layer different from the first layer, through the plurality of signal vias.

The two differential signal line pairs $240_1$ and $240_2$ are arranged adjacent to each other. In the second embodiment, other conductors such as ground lines and power supply lines are not interposed between the adjacent two differential signal line pairs $240_1$ and $240_2$.

Similarly, other conductors such as ground lines and power supply lines are not interposed between the adjacent differential signal line $240P_1$ and differential signal line $240N_1$ and between the adjacent differential signal line $240P_2$ and differential signal line $240N_2$.

In the second embodiment, the differential signal line pair $240_1$ ($240_2$) is wired to have a relative arrangement in which one differential signal line $240P_1$ ($240P_2$) and the other differential signal line $240N_1$ ($240N_2$) cross with each other in the middle of the differential signal line pair $240_1$ ($240_2$) in the wiring direction. Specifically, the positive and negative signal lines in the differential signal line pair $240_1$ cross with each other, and the positive and negative signal lines in the differential signal line pair $240_2$ cross with each other.

Specifically, the signal patterns on the side close to the signal output circuits $221_1$ and $221_2$ are arranged in the order of the negative signal pattern $242N_1$, the positive signal pattern $242P_1$, the positive signal pattern $242P_2$, and the negative signal pattern $242N_2$. Further, the signal patterns are arranged in the intermediate region between the signal output circuits and the signal input circuits (between the signal vias) in the order of the positive signal pattern $244P_1$, the negative signal pattern $244N_1$, the negative signal pattern $244N_2$, and the positive signal pattern $244P_2$. Further, the signal patterns on the side close to the signal input circuits $231_1$ and $231_2$ are arranged in the order of the negative signal pattern $246N_1$, the positive signal pattern $246P_1$, the positive signal pattern $246P_2$, and the negative signal pattern $246N_2$. In other words, the order of arrangement of the positive and negative wirings of the signal patterns $246P_1$, $246N_1$, $246P_2$, and $246N_2$ is the same as the order of arrangement of the positive and negative wirings of the signal patterns $242P_1$, $242N_1$, $242P_2$, and $242N_2$. On the other hand, the order of arrangement of the positive and negative wirings of the signal patterns $244P_1$, $244N_1$, $244P_2$, and $244N_2$ is different from the order of arrangement of the positive and negative wirings of the signal patterns $242P_1$, $242N_1$, $242P_2$, and $242N_2$.

In other words, on the side close to the signal output circuits $221_1$ and $221_2$, the positive signal line $240P_1$ in the differential signal line pair $240_1$ and the positive signal line $240P_2$ in the differential signal line pair $240_2$ are opposed to each other. In the intermediate region (between the signal vias), the negative signal line $240N_1$ of the differential signal line pair $240_1$ and the negative signal line $240N_2$ of the differential signal line pair $240_2$ are opposed to each other. Further, on the side close to the signal input circuits $231_1$ and $231_2$, the positive signal line $240P_1$ in the differential signal line pair $240_1$ and the positive signal line $240P_2$ in the differential signal line pair $240_2$ are opposed to each other.

In this manner, in the second embodiment, in the differential signal line pairs $240_1$ and $240_2$, the signal vias $243P_1$ and $243N_1$ and the signal vias $243P_2$ and $243N_2$ each serve as the region in which the differential signal lines have the relative arrangement of crossing with each other in the direction orthogonal to the wiring direction. Further, in the differential signal line pairs $240_1$ and $240_2$, the signal vias $245P_1$ and $245N_1$ and the signal vias $245P_2$ and $245N_2$ each form the region in which the differential signal lines have the relative arrangement of crossing with each other in the direction orthogonal to the wiring direction. Specifically, the differential signal line pair $240_1$ ($240_2$) is wired to have a relative arrangement in which one differential signal line $240P_1$ ($240P_2$) and the other differential signal line $240N_1$ ($240N_2$) cross with each other through the surface layer 201A and the surface layer 201B.

With the above-mentioned configuration, when the IC 211 and the IC 212 are arranged on the same surface 201A in terms of, for example, heat resistance and weight and height constraints, the crosstalk, which is in antiphase to the crosstalk superimposed on the positive signal lines, is superimposed on the negative signal lines. In this manner, in regard to the differential signals flowing through the respective differential signal lines, the slew rates of the positive signal and the negative signal are approximated to each other, to thereby reduce the variation amount of the crossing voltage of the pair of differential signals.

Further, in the adjacent two differential signal line pairs $240_1$ and $240_2$ among the plurality of differential signal line pairs, the regions in which the differential signal lines cross with each other are formed line-symmetrically to the center line $C_2$ passing along the wiring direction between the two differential signal line pairs $240_1$ and $240_2$.

In the second embodiment, the regions in which the differential signal lines cross with each other correspond to the signal vias $243P_1$ and $243N_1$ and the signal vias $243P_2$ and $243N_2$ as well as the signal vias $245P_1$ and $245N_1$ and the signal vias $245P_2$ and $245N_2$. Thus, the signal vias $243P_1$ and $243N_1$ and the signal vias $243P_2$ and $243N_2$ are arranged line-symmetrically to the center line $C_2$ and the signal vias $245P_1$ and $245N_1$ and the signal vias $245P_2$ and $245N_2$ are arranged line-symmetrically to the center line $C_2$. This line-symmetric configuration enables the phase of the crosstalk superimposed between the signal patterns $242P_1$ and $246P_1$ and the signal patterns $242P_2$ and $246P_2$ and the phase of the crosstalk superimposed between the signal pattern $244N_1$ and the signal pattern $244N_2$ to effectively match with each other. Consequently, the variation amount of the crossing voltage of the differential signals is effectively reduced.

In addition, in the second embodiment, the differential signal line pair $240_1$ and the differential signal line pair $240_2$ are arranged line-symmetrically to the center line $C_2$. Consequently, the variation amount of the crossing voltage of the differential signals is further effectively reduced.

Further, in the second embodiment, the adjacent two differential signal line pairs $240_1$ and $240_2$ are wired so that signals in phase are transmitted through respective wiring portions that are arranged adjacent to each other between the differential signal line pair $240_1$ and the differential signal line pair $240_2$. Specifically, the signal pattern $242P_1$ and the signal pattern $242P_2$ correspond to the respective wiring portions arranged adjacent to each other. Further, the signal pattern $244N_1$ and the signal pattern $244N_2$ correspond to the respective wiring portions arranged adjacent to each other and the signal pattern $246P_1$ and the signal pattern $246P_2$ correspond to the respective wiring portions arranged adjacent to each other.

In addition, the sum of the wiring lengths of the signal patterns $242P_1$ and $242P_2$ and the signal patterns $246P_1$ and $246P_2$, which are the wiring portions arranged adjacent to each other on the positive side, is substantially equal to the sum of the wiring lengths of the signal patterns $244N_1$ and $244N_2$, which are the wiring portions arranged adjacent to each other on the negative side.

Specifically, the sum of the wiring lengths of the wiring portions along which the differential signal line $240P_1$ of the differential signal line pair $240_1$ and the differential signal line $240P_2$ of the differential signal line pair $240_2$ are arranged adjacent to each other in the wiring direction is represented by $L_{1sum}$. Further, the sum of wiring lengths of the wiring portions along which the differential signal line 240N$_1$ of the differential signal line pair 240$_1$ and the differential signal line 240N$_2$ of the differential signal line pair 240$_2$ are arranged adjacent to each other in the wiring direction is represented by L$_{2sum}$. The two differential signal line pairs 240$_1$ and 240$_2$ are wired so that the wiring length L$_{1sum}$ and the wiring length L$_{2sum}$ are equal to each other.

Specifically, the sum of the wiring lengths of the signal pattern 242P$_1$ (242P$_2$) and the signal pattern 246P$_1$ (246P$_2$) is substantially equal to the wiring length of the signal pattern 244N$_1$ (244N$_2$).

As described above, the crosstalk superimposed on the positive wirings and the crosstalk superimposed on the negative wirings are in antiphase and equal in amount. Thus, the slew rates of the positive signal and the negative signal vary due to the crosstalk by the same amount. Consequently, the variation amount of the crossing voltage of the pair of differential signals is further reduced.

Note that, the description in the second embodiment has been given of the case where two signal vias are formed for each of the differential signal lines 240P$_1$, 240N$_1$, 240P$_2$, and 240N$_2$, but the number of the signal vias may be three or more. In this case, it is preferred that the number of the signal vias be a minimum necessary number or less (two or less) in consideration of signal reflection caused by impedance mismatch between the signal pattern and the signal via and loss of differential properties between the positive signal and the negative signal.

Further, in the second embodiment, the printed wiring board 201 having the four-layer structure is exemplified, but the number of layers is not limited to four. Further, other kinds of wiring than the signal lines, such as ground lines, may be interposed between the signal pattern 242P$_1$ and the signal pattern 242P$_2$ and between the signal pattern 244N$_1$ and the signal pattern 244N$_2$.

Further, the differential signals propagating through the respective wiring portions (signal pattern 242P$_1$ and signal pattern 242P$_2$, signal pattern 244N$_1$ and signal pattern 244N$_2$, and signal pattern 246P$_1$ and signal pattern 246P$_2$) arranged adjacent to each other may not be in phase. For example, even when the differential signals are in antiphase or are random pulses, the same effect is exhibited. Thus, the order of arrangement of the positive and negative wirings in the differential signal line pairs 240$_1$ and 240$_2$ is not limited to the one described in the second embodiment, and any combinations of the wirings are possible.

Further, the description in the second embodiment has been given of the case where the printed wiring board 201 includes the two differential signal line pairs 240$_1$ and 240$_2$, but the present invention is not limited thereto. The present invention is also applicable to the case where the printed wiring board 201 includes three or more differential signal line pairs. In this case, it is only necessary that two adjacent differential signal line pairs among the plurality of differential signal line pairs be arranged as described in the second embodiment so that each differential signal line pair is wired to have a relative arrangement in which one signal line and the other signal line cross with each other in the middle in the wiring direction.

Third Embodiment

Figure 4:
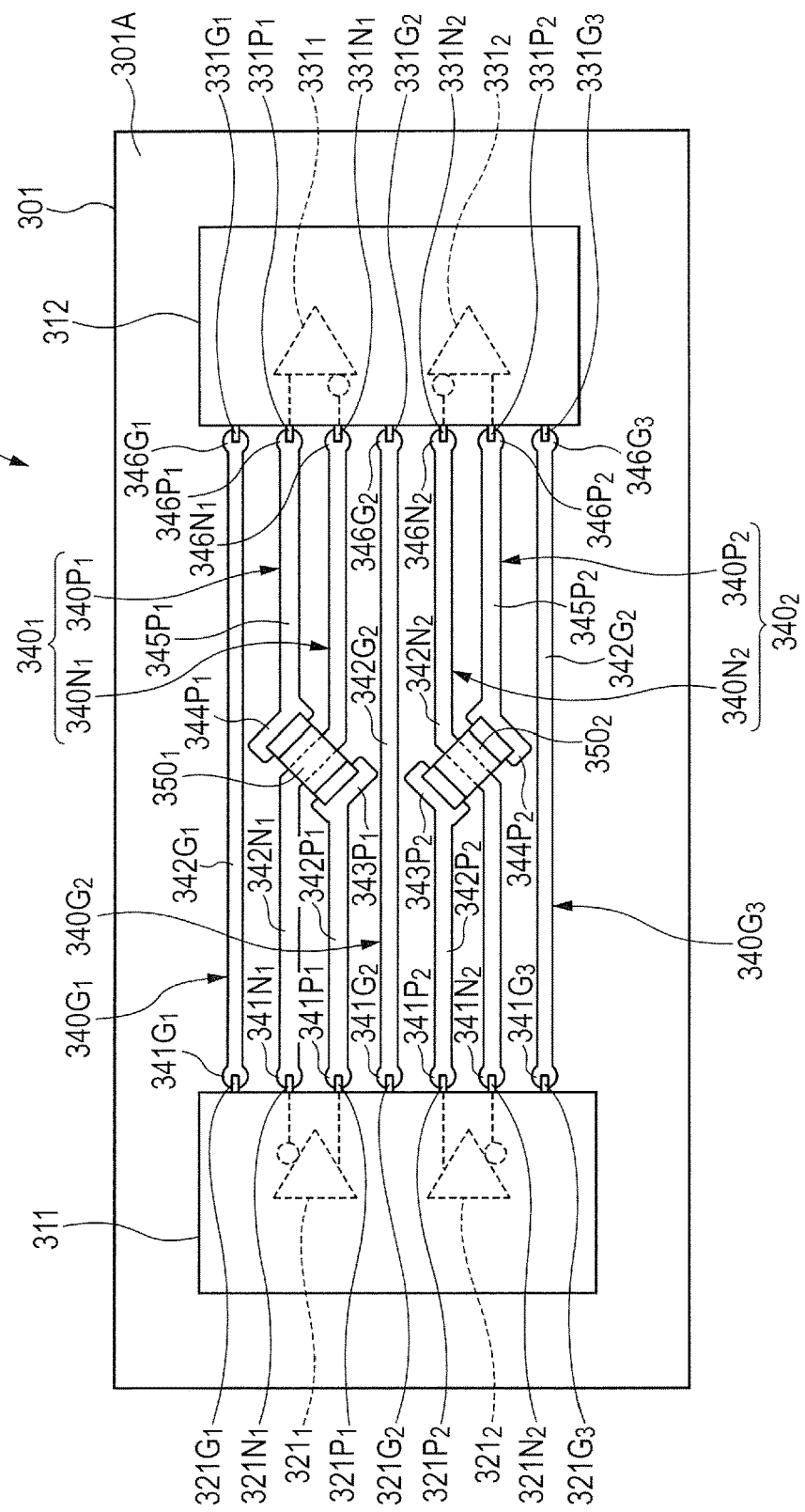
FIG. 4 is a plan view for illustrating a printed circuit board according to a third embodiment of the present invention.

Next, a printed circuit board according to a third embodiment of the present invention is described. FIG. 4 is a plan view for illustrating the printed circuit board according to the third embodiment of the present invention. A printed circuit board 300 illustrated in FIG. 4 includes a printed wiring board 301, and an IC 311 and an IC 312 serving as a first semiconductor package and a second semiconductor package that are mounted on the printed wiring board 301. The printed circuit board 300 further includes chip components (electronic elements) 350$_1$ and 350$_2$ serving as bridge members.

The printed wiring board 301 is formed of a single-sided board (single-layer printed wiring board). The IC 311 and the IC 312 are mounted on a surface layer 301A of the printed wiring board 301. In other words, the IC 311 and the IC 312 are mounted on the same surface 301A.

The IC 311 includes a plurality of (two in the third embodiment) signal output circuits (signal output units, drivers) 321$_1$ and 321$_2$. Further, the IC 312 includes a plurality of (two in the third embodiment) signal input circuits (signal input units, receivers) 331$_1$ and 331$_2$.

The signal output circuit 321$_1$ includes a pair of output terminals 321P$_1$ and 321N$_1$ configured to output a pair of differential signals (positive differential signal P1 and negative differential signal N1) P1 and N1. Specifically, the signal output circuit 321$_1$ includes the output terminal 321P$_1$ configured to output the differential signal P1 and the output terminal 321N$_1$ configured to output the differential signal N1.

Similarly, the signal output circuit 321$_2$ includes a pair of output terminals 321P$_2$ and 321N$_2$ configured to output a pair of differential signals (positive differential signal P2 and negative differential signal N2) P2 and N2. Specifically, the signal output circuit 321$_2$ includes the output terminal 321P$_2$ configured to output the differential signal P2 and the output terminal 321N$_2$ configured to output the differential signal N2. Those plurality of signal output circuits 321$_1$ and 321$_2$ have the same circuit configuration.

The signal input circuit 331$_1$ includes a pair of input terminals 331P$_1$ and 331N$_1$ configured to input the pair of differential signals P1 and N1. Specifically, the signal input circuit 331$_1$ includes the input terminal 331P$_1$ configured to input the differential signal P1 and the input terminal 331N$_1$ configured to input the differential signal N1.

Similarly, the signal input circuit 331$_2$ includes a pair of input terminals 331P$_2$ and 331N$_2$ configured to input the pair of differential signals P2 and N2. Specifically, the signal input circuit 331$_2$ includes the input terminal 331P$_2$ configured to input the differential signal P2 and the input terminal 331N$_2$ configured to input the differential signal N2. Those plurality of signal input circuits 331$_1$ and 331$_2$ have the same circuit configuration.

In the third embodiment, the IC 311 includes a plurality of ground terminals 321G$_1$, 321G$_2$, and 321G$_3$, and the IC 312 includes a plurality of ground terminals 331G$_1$, 331G$_2$, and 331G$_3$.

The output terminals 321P$_1$ and 321N$_1$ are arranged between the ground terminals 321G$_1$ and 321G$_2$, and the output terminals 321P$_2$ and 321N$_2$ are arranged between the ground terminals 321G$_2$ and 321G$_3$. The input terminals 331P$_1$ and 331N$_1$ are arranged between the ground terminals 331G$_1$ and 331G$_2$, and the input terminals 331P$_2$ and 331N$_2$ are arranged between the ground terminals 331G$_2$ and 331G$_3$.

A plurality of differential signal line pairs each serving as transmission paths for a pair of differential signals are formed on the printed wiring board 301 in parallel to each other. Ends of each differential signal line pair on one side in the wiring direction are connected to the pair of output terminals, and ends thereof on the other side in the wiring direction are connected to the pair of input terminals.

Specifically, a plurality of (two in the third embodiment) differential signal line pairs 340$_1$ and 340$_2$ are formed on the surface layer 301A of the printed wiring board 301 in parallel to each other with an interval therebetween in a direction orthogonal to the wiring direction. The differential signal line pair $340_1$ includes a differential signal line $340P_1$ serving as a transmission path for the positive differential signal P1 and a differential signal line $340N_1$ serving as a transmission path for the negative differential signal N1. The differential signal line pair $340_2$ includes a differential signal line $340P_2$ serving as a transmission path for the positive differential signal P2 and a differential signal line $340N_2$ serving as a transmission path for the negative differential signal N2. The differential signal line $340P_1$ and the differential signal line $340N_1$ are arranged adjacent to each other. The differential signal line $340P_2$ and the differential signal line $340N_2$ are arranged adjacent to each other.

Further, a ground line or a power supply line, specifically, a ground line $340G_2$ in the third embodiment, is formed on the printed wiring board 301 between two adjacent differential signal line pairs $340_1$ and $340_2$ among the plurality of differential signal line pairs. The differential signal line pair $340_1$ and the differential signal line pair $340_2$ are arranged adjacent to each other across the ground line $340G_2$, and hence the differential impedance is stabilized. Ground lines $340G_1$ and $340G_3$ are formed on the printed wiring board 301. The differential signal line pair $340_1$ is sandwiched by the pair of ground lines $340G_1$ and $340G_2$, and hence the differential impedance is further stabilized. The differential signal line pair $340_2$ is sandwiched by the pair of ground lines $340G_2$ and $340G_3$, and hence the differential impedance is further stabilized.

The differential signal line $340N_1$ includes a land $341N_1$, a signal pattern $342N_1$, and a land $346N_1$. The land $341N_1$ is a conductor which is formed on the surface layer 301A and to which the output terminal $321N_1$ is joined by solder or the like. The land $341N_1$ corresponds to one end of the differential signal line $340N_1$ in the wiring direction. The land $346N_1$ is a conductor which is formed on the surface layer 301A and to which the input terminal $331N_1$ is joined by solder or the like. The land $346N_1$ corresponds to the other end of the differential signal line $340N_1$ in the wiring direction. The signal pattern $342N_1$ is a conductor formed on the surface layer 301A, and electrically connects the land $341N_1$ and the signal via $346N_1$ to each other.

The differential signal line $340P_1$ includes a land $341P_1$, a signal pattern $342P_1$, a land $343P_1$, a land $344P_1$, a signal pattern $345P_1$, and a land $346P_1$. The land $341P_1$ is a conductor which is formed on the surface layer 301A and to which the output terminal $321P_1$ is joined by solder or the like. The land $341P_1$ corresponds to one end of the differential signal line $340P_1$ in the wiring direction. The land $346P_1$ is a conductor formed on the surface layer 301A and to which the input terminal $331P_1$ is joined by solder or the like. The land $346P_1$ corresponds to the other end of the differential signal line $340P_1$ in the wiring direction. The land $343P_1$ and the land $344P_1$ are formed on the surface layer 301A and arranged across the signal pattern $342N_1$. The signal pattern $342P_1$ electrically connects the land $341P_1$ and the land $343P_1$ to each other. The signal pattern $345P_1$ electrically connects the land $344P_1$ and the land $346P_1$ to each other.

In the third embodiment, one end of the chip component $350_1$ is joined to the land $343P_1$, and the other end thereof is connected to the land $344P_1$. In this manner, one differential signal line $340P_1$ in the pair of differential signal lines $340N_1$ and $340P_1$ is wired on the surface layer 301A so as to straddle the other differential signal line $340N_1$ on the outside of the printed wiring board 301 with use of the chip component $350_1$.

The differential signal line $340N_2$ includes a land $341N_2$, a signal pattern $342N_2$, and a land $346N_2$. The land $341N_2$ is a conductor which is formed on the surface layer 301A and to which the output terminal $321N_2$ is joined by solder or the like. The land $341N_2$ corresponds to one end of the differential signal line $340N_2$ in the wiring direction. The land $346N_2$ is a conductor formed on the surface layer 301A and to which the input terminal $331N_2$ is joined by solder or the like. The land $346N_2$ corresponds to the other end of the differential signal line $340N_2$ in the wiring direction. The signal pattern $342N_2$ is a conductor formed on the surface layer 301A, and electrically connects the land $341N_2$ and the land $346N_2$ to each other.

The differential signal line $340P_2$ includes a land $341P_2$, a signal pattern $342P_2$, a land $343P_2$, a land $344P_2$, a signal pattern $345P_2$, and a land $346P_2$. The land $341P_2$ is a conductor which is formed on the surface layer 301A and to which the output terminal $321P_2$ is joined by solder or the like. The land $341P_2$ corresponds to one end of the differential signal line $340P_2$ in the wiring direction. The land $346P_2$ is a conductor which is formed on the surface layer 301A and to which the input terminal $331P_2$ is joined by solder or the like. The land $346P_2$ corresponds to the other end of the differential signal line $340P_2$ in the wiring direction. The land $343P_2$ and the land $344P_2$ are formed on the surface layer 301A and arranged across the signal pattern $342N_2$. The signal pattern $342P_2$ electrically connects the land $341P_2$ and the land $343P_2$ to each other. The signal pattern $345P_2$ electrically connects the land $344P_2$ and the land $346P_2$ to each other.

In the third embodiment, one end of the chip component $350_2$ is joined to the land $343P_2$, and the other end thereof is connected to the land $344P_2$. In this manner, one differential signal line $340P_2$ in the pair of differential signal lines $340N_2$ and $340P_2$ is wired on the surface layer 301A so as to straddle the other differential signal line $340N_2$ on the outside of the printed wiring board 301 with use of the chip component $350_2$.

The ground line $340G_1$ includes a land $341G_1$, a ground pattern $342G_1$, and a land $346G_1$. The land $341G_1$ is a conductor which is formed on the surface layer 301A and to which the ground terminal $321G_1$ is joined by solder or the like. The land $341G_1$ corresponds to one end of the ground line $340G_1$ in the wiring direction. The land $346G_1$ is a conductor which is formed on the surface layer 301A and to which the ground terminal $331G_1$ is joined by solder or the like. The land $346G_1$ corresponds to the other end of the ground line $340G_1$ in the wiring direction. The ground pattern $342G_1$ electrically connects the land $341G_1$ and the land $346G_1$ to each other.

Similarly, the ground line $340G_2$ includes a land $341G_2$, a ground pattern $342G_2$, and a land $346G_2$. The land $341G_2$ is a conductor which is formed on the surface layer 301A and to which the ground terminal $321G_2$ is joined by solder or the like. The land $341G_2$ corresponds to one end of the ground line $340G_2$ in the wiring direction. The land $346G_2$ is a conductor which is formed on the surface layer 301A and to which the ground terminal $331G_2$ is joined by solder or the like. The land $346G_2$ corresponds to the other end of the ground line $340G_2$ in the wiring direction. The ground pattern $342G_2$ electrically connects the land $341G_2$ and the land $346G_2$ to each other.

Similarly, the ground line $340G_3$ includes a land $341G_3$, a ground pattern $342G_3$, and a land $346G_3$. The land $341G_3$ is a conductor which is formed on the surface layer 301A and to which the ground terminal $321G_3$ is joined by solder or the like. The land $341G_3$ corresponds to one end of the ground line $340G_3$ in the wiring direction. The land $346G_3$ is a conductor which is formed on the surface layer 301A and to which the ground terminal $331G_3$ is joined by solder or the like. The land $346G_3$ corresponds to the other end of the ground line $340G_3$ in the wiring direction. The ground pattern $342G_3$ electrically connects the land $341G_3$ and the land $346G_3$ to each other.

In the third embodiment, the differential signal line pair $340_1$ ($340_2$) is wired to have a relative arrangement in which one differential signal line $340P_1$ ($340P_2$) and the other differential signal line $340N_1$ ($340N_2$) cross with each other in the middle of the differential signal line pair $340_1$ ($340_2$) in the wiring direction. Specifically, the positive and negative signal lines in the differential signal line pair $340_1$ cross with each other, and the positive and negative signal lines in the differential signal line pair $340_2$ cross with each other.

Specifically, the signal patterns on the side close to the signal output circuits $321_1$ and $321_2$ are arranged in the order of the negative signal pattern $342N_1$, the positive signal pattern $342P_1$, the positive signal pattern $342P_2$, and the negative signal pattern $342N_2$. Further, the signal patterns on the side close to the signal input circuits $331_1$ and $331_2$ are arranged in the order of the positive signal pattern $345P_1$, the negative signal pattern $342N_1$, the negative signal pattern $342N_2$, and the positive signal pattern $345P_2$. In other words, the order of arrangement of the signal patterns is changed by crossing from the order of the signal patterns $342N_1$, $342P_1$, $342P_2$, and $342N_2$ to the order of the signal patterns $345P_1$, $342N_1$, $342N_2$, and $345P_2$.

In other words, on the side close to the signal output circuits $321_1$ and $321_2$, the positive signal line $340P_1$ in the differential signal line pair $340_1$ and the positive signal line $340P_2$ in the differential signal line pair $340_2$ are opposed to each other. Further, on the side close to the signal input circuits $331_1$ and $331_2$, the negative signal line $340N_1$ in the differential signal line pair $340_1$ and the negative signal line $340N_2$ in the differential signal line pair $340_2$ are opposed to each other.

As described above, in the third embodiment, in the differential signal line pairs $340_1$ and $340_2$, the chip components $350_1$ and $350_2$ form the regions in which the relative arrangements cross with each other in the direction orthogonal to the wiring direction. As described above, the differential signal lines $340P_1$ and $340P_2$ can be wired to straddle the differential signal lines $340N_1$ and $340N_2$ with use of the chip components $350_1$ and $350_2$, and hence the regions in which the relative arrangements cross with each other can be formed on the surface layer 301A.

A resistor element or a capacitor element is preferred as the chip components $350_1$ and $350_2$. Component constants suitable for waveform transmission are selected, but a low-resistance resistor element is particularly preferred.

According to the third embodiment, crosstalk is superimposed from the positive signal line $340P_2$ of the differential signal line $340_2$ onto the positive signal line $340P_1$ of the differential signal line $340_1$. Crosstalk in antiphase to that superimposed on the positive signal line is superimposed from the negative signal line $340N_2$ of the differential signal line $340_2$ onto the negative signal line $340N_1$ of the differential signal line $340_1$.

Further, crosstalk is superimposed from the positive signal line $340P_1$ of the differential signal line $340_1$ onto the positive signal line $340P_2$ of the differential signal line $340_2$. Crosstalk in antiphase to that superimposed on the positive signal line is superimposed from the negative signal line $340N_1$ of the differential signal line $340_1$ onto the negative signal line $340N_2$ of the differential signal line $340_2$.

In this manner, the inexpensive one-sided printed wiring board 301 is configured so that the slew rates of the positive and negative signals flowing through the differential signal lines are approximated to each other, to thereby reduce the variation amount of the crossing voltage of the pair of differential signals.

Note that, the number of layers in the printed wiring board 301 may be two or more. Further, the same number of chip components may be mounted for each differential signal line. When two chip components are arranged for each differential signal line pair, it is preferred that one chip component is arranged for each of the positive and negative wiring so that the positive and negative circuit configurations are the same.

Further, in the adjacent two differential signal line pairs $340_1$ and $340_2$ among the plurality of differential signal line pairs, the regions in which the differential signal lines cross with each other are formed line-symmetrically to the center line passing along the wiring direction between the two differential signal line pairs $340_1$ and $340_2$. In the third embodiment, the regions in which the arrangements of the two differential signal line pairs $340_1$ and $340_2$ among the plurality of differential signal line pairs are formed line-symmetrically to the ground line $340G_2$ formed along the center line.

In the third embodiment, the regions in which the arrangements cross with each other are formed by the chip components $350_1$ and $350_2$. Thus, the chip component $350_1$ and the chip component $350_2$ are arranged line-symmetrically to the ground line $340G_2$. This line-symmetric configuration enables the variation amount of the crossing voltage of the differential signals to be effectively reduced.

In addition, in the third embodiment, the differential signal line pair $340_1$ and the differential signal line pair $340_2$ are arranged line-symmetrically to the ground line $340G_2$ formed along the center line. Consequently, the variation amount of the crossing voltage of the differential signals is further effectively reduced.

Further, in the third embodiment, the adjacent two differential signal line pairs $340_1$ and $340_2$ are wired so that signals in phase are transmitted through respective wiring portions that are arranged adjacent to each other between the differential signal line pair $340_1$ and the differential signal line pair $340_2$. Specifically, the signal pattern $342P_1$ and the signal pattern $342P_2$ correspond to the wiring portions arranged adjacent to each other. Further, the signal pattern $342N_1$ and the signal pattern $342N_2$ correspond to the wiring portions arranged adjacent to each other.

When the differential signals propagating through the wiring portions arranged adjacent to each other are in phase, the electric fields are strongly coupled between the wiring portions arranged adjacent to each other. Consequently, the rise/fall time of the signal is shortened, and the opening of the eye pattern is improved (enlarged) in addition to the improvement in variation of the crossing voltage.

In addition, the wiring lengths of the signal patterns $342P_1$ and $342P_2$, which are the wiring portions arranged adjacent to each other on the positive side, and the wiring lengths of the signal patterns $342N_1$ and $342N_2$, which are the wiring portions arranged adjacent to each other on the negative side (the wiring length from the region in which the pattern arrangements cross with each other to the input terminals) are substantially equal to each other. Thus, the crosstalk superimposed on the positive wiring and the crosstalk superimposed on the negative wiring are in antiphase and equal in amount. Consequently, the slew rates of the positive signal and the negative signal vary due to the crosstalk by the same amount. Consequently, the variation amount of the crossing voltage of the pair of differential signals is further reduced.

Note that, the description in the third embodiment is given of the case where the printed wiring board 301 includes the ground lines $340G_1$ to $340G_3$, but the ground lines $340G_1$ to $340G_3$ may be omitted.

Further, the differential signals propagating through the wiring portions arranged adjacent to each other may not be in phase. For example, even when the differential signals are in antiphase or are random pulses, the same effect is exhibited. Thus, the order of arrangement of the positive and negative wirings in the differential signal line pairs $340_1$ and $340_2$ is not limited to the one described in the third embodiment, and any combinations of the wirings are possible.

Further, the description in the third embodiment has been given of the case where the printed wiring board 301 includes the two differential signal line pairs $340_1$ and $340_2$, but the present invention is not limited thereto. The present invention is also applicable to the case where the printed wiring board 301 includes three or more differential signal line pairs. In this case, it is only necessary that two adjacent differential signal line pairs among the plurality of differential signal line pairs be arranged as described in the third embodiment so that each differential signal line pair is wired to have a relative arrangement in which one signal line and the other signal line cross with each other in the middle in the wiring direction.

Fourth Embodiment

Figure 5:
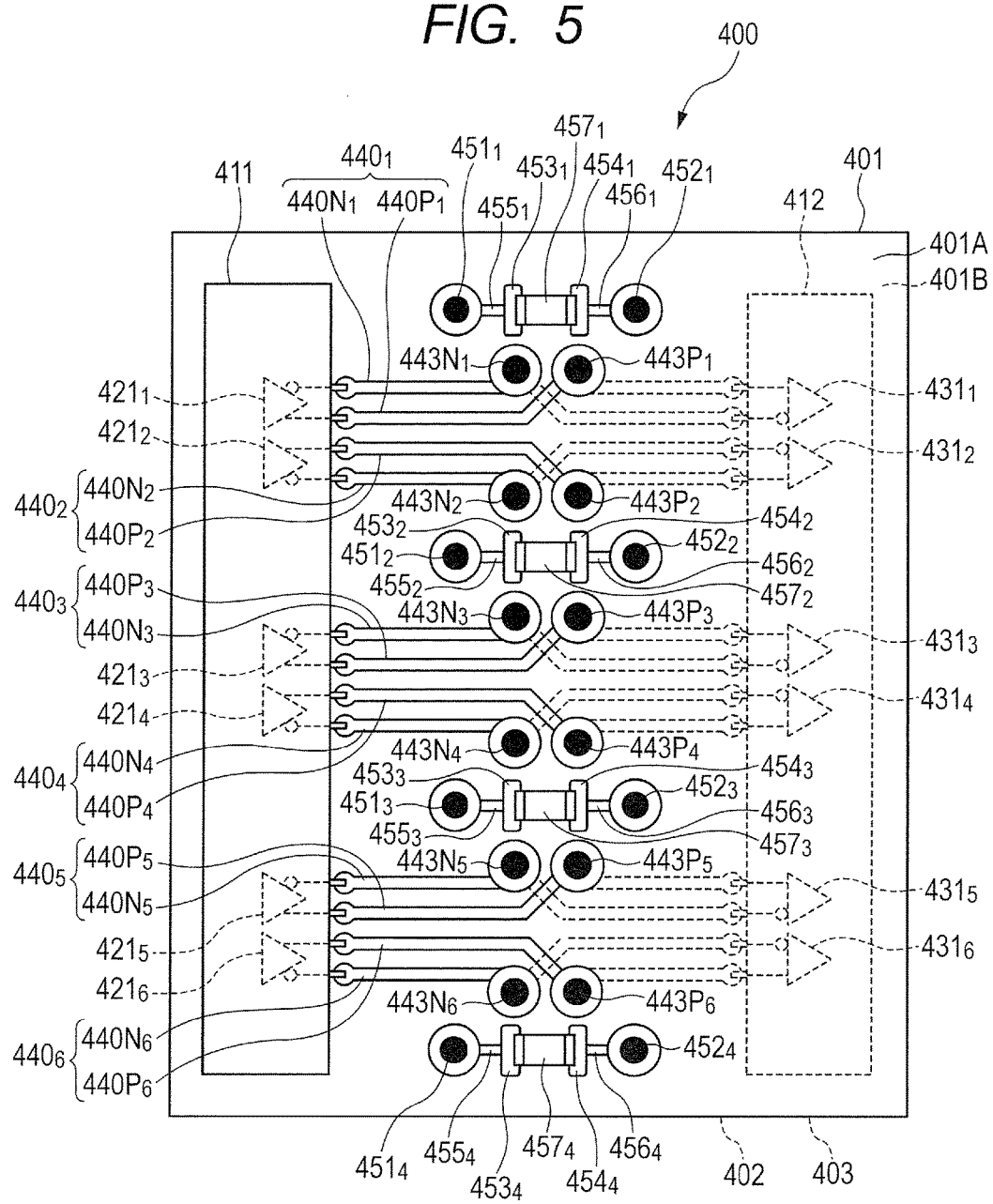
FIG. 5 is a plan view for illustrating a printed circuit board according to a fourth embodiment of the present invention.

Next, a printed circuit board according to a fourth embodiment of the present invention is described. FIG. 5 is a plan view for illustrating the printed circuit board according to the fourth embodiment of the present invention. A printed circuit board 400 illustrated in FIG. 5 includes a printed wiring board 401, and an IC 411 and an IC 412 serving as a first semiconductor package and a second semiconductor package that are mounted on the printed wiring board 401.

The printed wiring board 401 is a multilayer (at least three-layer, for example, four-layer) printed wiring board including a plurality of conductor layers each having a conductor pattern arranged thereon. One of the internal conductor layers is a power supply layer mainly having a power supply pattern 402 (not shown) arranged thereon, and another one of the internal conductor layers is a ground layer mainly having a ground pattern 403 (not shown) arranged thereon. The power supply pattern 402 is a planar conductor to be applied with a power supply potential. The ground pattern 403 is a planar conductor to be applied with a ground potential. The power supply pattern 402 and the ground pattern 403, which are planar, have a wide area so that the power supply potential and the ground potential are stabilized. Note that, another conductor (such as a ground line or a signal line) than the conductor to be applied with the power supply potential may be arranged on the power supply layer. Further, another conductor (such as a power supply line or a signal line) than the conductor to be applied with the ground potential may be arranged on the ground layer.

A pair of surface layers (surfaces) 401A and 401B of the printed wiring board 401 are signal wiring layers (first signal wiring layer and second signal wiring layer) mainly having signal lines arranged thereon. Note that, another conductor (such as a ground line or a power supply line) than the conductor to be applied with signals may be arranged on the signal wiring layers.

The IC 411 is mounted on one of the pair of surface layers 401A and 401B, specifically, the surface layer 401A. The IC 412 is mounted on the other surface layer 401B.

In the fourth embodiment, the ground layer is arranged adjacent to the surface layer 401A serving as the first signal wiring layer through intermediation of an insulating layer, and the power supply layer is arranged adjacent to the surface layer 401B serving as the second signal wiring layer through intermediation of an insulating layer. In this manner, the four conductor layers of the first signal wiring layer, the ground layer, the power supply layer, and the second signal wiring layer are laminated through intermediation of the insulating layers to construct the four-layer printed wiring board 401.

The IC 411 includes a plurality of (six in the fourth embodiment) signal output circuits (signal output units, drivers) $421_1$, $421_2$, $421_3$, $421_4$, $421_5$, and $421_6$. Further, the IC 412 includes a plurality of (six in the fourth embodiment) signal input circuits (signal input units, receivers) $431_1$, $431_2$, $431_3$, $431_4$, $431_5$, and $431_6$. The signal output circuits $421_1$ to $421_6$ each have the same configuration as the signal output circuits $121_1$ and $121_2$ described in the above-mentioned first embodiment. The signal input circuits $431_1$ to $431_6$ each have the same configuration as the signal input circuits $131_1$ and $131_2$ described in the above-mentioned first embodiment.

A plurality of differential signal line pairs each serving as transmission paths for a pair of differential signals are formed on the printed wiring board 401 in parallel to each other. Ends of each differential signal line pair on one side in the wiring direction are connected to the pair of output terminals, and ends thereof on the other side in the wiring direction are connected to the pair of input terminals.

Specifically, a plurality of (six in the fourth embodiment) differential signal line pairs $440_1$, $440_2$, $440_3$, $440_4$, $440_5$, and $440_6$ are formed on the printed wiring board 401 in parallel to each other with an interval therebetween in a direction orthogonal to the wiring direction.

The differential signal line pair $440_1$ includes a differential signal line $440P_1$ serving as a transmission path for the positive differential signal P1 and a differential signal line $440N_1$ serving as a transmission path for the negative differential signal N1. The differential signal line pair $440_2$ includes a differential signal line $440P_2$ serving as a transmission path for the positive differential signal P2 and a differential signal line $440N_2$ serving as a transmission path for the negative differential signal N2. The pair of differential signal lines $440_3$ include a differential signal line $440P_3$ serving as a transmission path for the positive differential signal P3 and a differential signal line $440N_3$ serving as a transmission path for the negative differential signal N3. The pair of differential signal lines $440_4$ include a differential signal line $440P_4$ serving as a transmission path for the positive differential signal P4 and a differential signal line $440N_4$ serving as a transmission path for the negative differential signal N4. The pair of differential signal lines $440_5$ include a differential signal line $440P_5$ serving as a transmission path for the positive differential signal P5 and a differential signal line $440N_5$ serving as a transmission path for the negative differential signal N5. The pair of differential signal lines $440_6$ include a differential signal line $440P_6$ serving as a transmission path for the positive differential signal P6 and a differential signal line $440N_6$ serving as a transmission path for the negative differential signal N6.

The pairs of differential signal lines $440_1$, $440_3$, and $440_5$ have the same wiring structure as that of the pair of differential signal lines $140_1$ in the above-mentioned first embodiment. The pairs of differential signal lines $440_2$, $440_4$, and $440_6$ have the same wiring structure as that of the pair of differential signal line $140_2$ in the above-mentioned first embodiment. Thus, in the fourth embodiment, the plurality of (three) wirings having the same structure as that of the two pairs of differential signal lines $140_1$ and $140_2$ in the above-mentioned first embodiment are formed on the printed wiring board 401.

In the fourth embodiment, similarly to the first embodiment, each of the differential signal line pairs $440_1$ to $440_6$ is wired to have a relative arrangement in which one differential signal line $440P_1$ to $440P_6$ and the other differential signal line $440N_1$ to $440N_6$ cross with each other in the middle in the wiring direction.

Further, in the fourth embodiment, in the differential signal line pairs $440_1$ to $440_6$, the signal vias $443P_1$ and $443N_1$ to $443P_6$ and $443N_6$ form the regions in which the relative arrangements cross with each other in the direction orthogonal to the wiring direction.

In addition, in the fourth embodiment, a ground via $451_1$ and a power supply via $452_1$ are formed in the printed wiring board 401 in the vicinity of the signal vias $443N_1$ and $443P_1$. A land $453_1$ and a land $454_1$ are formed on the printed wiring board 401 in the vicinity of the signal vias $443N_1$ and $443P_1$. The ground via $451_1$ and the land $453_1$ are electrically connected to each other through a ground line $455_1$. The power supply via $452_1$ and the land $454_1$ are electrically connected to each other through a power supply line $456_1$. Then, a capacitor element $457_1$ is joined to the pair of lands $453_1$ and $454_1$. In this manner, the capacitor element $457_1$ is arranged in the vicinity of the signal vias $443N_1$ and $443P_1$, and is electrically connected to the power supply pattern 402 and the ground pattern 403 through the power supply via $452_1$ and the ground via $451_1$.

Further, a ground via $451_2$ and a power supply via $452_2$ are formed in the printed wiring board 401 in the vicinity of the signal vias $443N_2$ and $443P_2$. In this embodiment, the ground via $451_2$ and the power supply via $452_2$ are formed in the vicinity of the signal vias $443N_3$ and $443P_3$. In other words, the ground via $451_2$ and the power supply via $452_2$ are formed between the signal vias $443N_2$ and $443P_2$ and the signal vias $443N_3$ and $443P_3$.

Further, a land $453_2$ and a land $454_2$ are formed on the printed wiring board 401 in the vicinity of the signal vias $443N_2$ and $443P_2$. The ground via $451_2$ and the land $453_2$ are electrically connected to each other through a ground line $455_2$. The power supply via $452_2$ and the land $454_2$ are electrically connected to each other through a power supply line $456_2$. Then, a capacitor element $457_2$ is joined to the pair of lands $453_2$ and $454_2$. In this manner, the capacitor element $457_2$ is electrically connected to the power supply pattern 402 and the ground pattern 403 through the power supply via $452_2$ and the ground via $451_2$, respectively. The capacitor element $457_2$ is arranged in the vicinity of the signal vias $443N_2$ and $443P_2$ and the signal vias $443N_3$ and $443P_3$.

Similarly, a ground via $451_3$, a ground line $455_3$, lands $453_3$ and $454_3$, and a power supply via $452_3$ are formed between the signal vias $443N_4$ and $443P_4$ and the signal vias $443N_5$ and $443P_5$. Then, a capacitor element $457_3$ is joined to the pair of lands $453_3$ and $454_3$.

Similarly, a ground via $451_4$, a ground line $455_4$, lands $453_4$ and $454_4$, and a power supply via $452_4$ are formed in the vicinity of the signal vias $443N_6$ and $443P_6$. Then, a capacitor element $457_4$ is joined to the pair of lands $453_4$ and $454_4$.

As described above, the differential signal line pairs are arranged as a pair, and further the capacitor elements 457 are arranged adjacent to the signal vias 443N and 443P. In particular, the capacitor element $457_2$ is arranged between the signal vias $443N_2$ and $443P_2$ and the signal vias $443N_3$ and $443P_3$, and the capacitor element $457_3$ is arranged between the signal vias $443N_4$ and $443P_4$ and the signal vias $443N_5$ and $443P_5$. In this manner, the gaps among the signal vias are increased so that crosstalk is less liable to be generated among the signal vias, to thereby reduce the variation amount of the crossing voltage of the differential signals.

Further, the return path of the signal flowing through each differential signal line 440 on the surface layer 401A side is the ground pattern 403 formed on the internal layer, and the return path of the signal flowing through each differential signal line 440 on the surface layer 401B side is the power supply pattern 402. The capacitor element 457 (power supply via and ground via) is arranged in the vicinity of the signal via 443, and hence the return path of the signal can be secured to reduce the influence of signal reflection caused by impedance mismatch of discontinuous return paths. Consequently, the variation amount of the crossing voltage of the differential signals is reduced.

Note that, although not illustrated, when the return path of the signal flowing through the differential signal lines is only the ground, it is preferred to form a ground via without arranging a bypass capacitor. In the case of the above-mentioned configuration, only the return current flows from the ground pattern at the signal vias, and hence the influence of signal reflection caused by discontinuous return paths can be reduced. Consequently, the variation amount of the crossing voltage of the differential signals is reduced. In addition, the wiring area can be reduced because no components such as a capacitor element are mounted.

Fifth Embodiment

Figure 6:
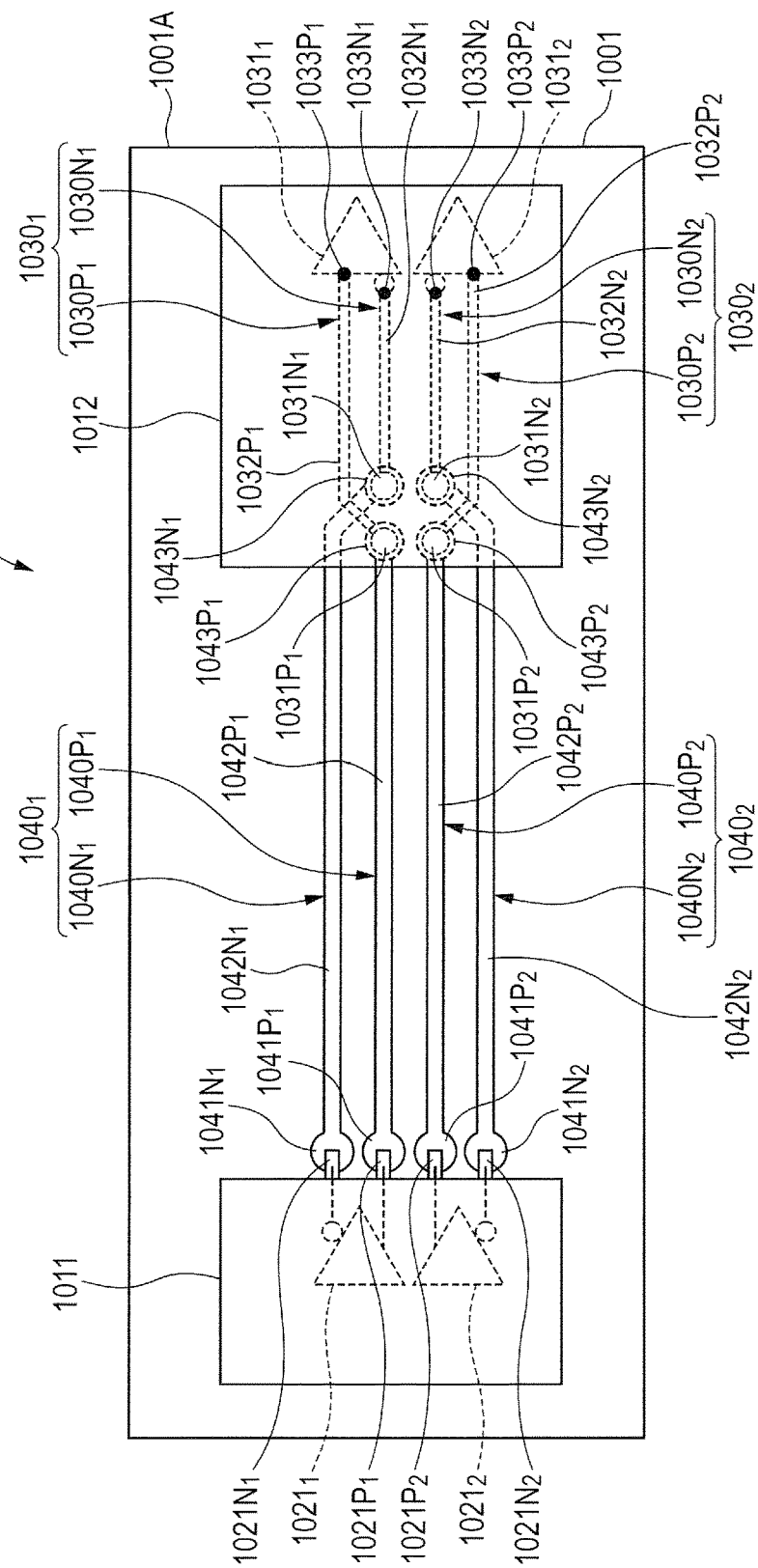
FIG. 6 is a plan view for illustrating a printed circuit board according to a fifth embodiment of the present invention.

Next, a printed circuit board according to a fifth embodiment of the present invention is described. FIG. 6 is a plan view for illustrating the printed circuit board according to the fifth embodiment of the present invention. A printed circuit board 1000 illustrated in FIG. 6 includes a printed wiring board 1001, and an IC 1011 and an IC 1012 serving as a first semiconductor package and a second semiconductor package that are mounted on the printed wiring board 1001.

The printed wiring board 1001 is a multilayer (for example, four-layer) printed wiring board including a plurality of conductor layers each having a conductor pattern arranged thereon. One of the internal conductor layers is a power supply layer mainly having a power supply pattern (not shown) arranged thereon, and another one of the internal conductor layers is a ground layer mainly having a ground pattern (not shown) arranged thereon. The power supply pattern is a planar conductor to be applied with a power supply potential. The ground pattern is a planar conductor to be applied with a ground potential. The power supply pattern and the ground pattern, which are planar, have a wide area so that the power supply potential and the ground potential are stabilized. Note that, another conductor (such as a ground line or a signal line) than the conductor to be applied with the power supply potential may be arranged on the power supply layer. Further, another conductor (such as a power supply line or a signal line) than the conductor to be applied with the ground potential may be arranged on the ground layer.

The IC 1011 and the IC 1012 are mounted on a surface layer 1001A of the printed wiring board 1001. In other words, the IC 1011 and the IC 1012 are mounted on the same surface 1001A.

The ground layer is arranged adjacent to the surface layer 1001A through intermediation of an insulating layer.

The IC 1011 includes a plurality of (two in the fifth embodiment) signal output circuits (signal output units, drivers) 1021$_1$ and 1021$_2$. Further, the IC 1012 includes a plurality of (two in the fifth embodiment) signal input circuits (signal input units, receivers) 1031$_1$ and 1031$_2$.

The signal output circuit 1021$_1$ includes a pair of output terminals 1021P$_1$ and 1021N$_1$ configured to output a pair of differential signals (positive differential signal P1 and negative differential signal N1) P1 and N1. Specifically, the signal output circuit 1021$_1$ includes the output terminal 1021P$_1$ configured to output the differential signal P1 and the output terminal 1021N$_1$ configured to output the differential signal N1.

Similarly, the signal output circuit 1021$_2$ includes a pair of output terminals 1021P$_2$ and 1021N$_2$ configured to output a pair of differential signals (positive differential signal P2 and negative differential signal N2) P2 and N2. Specifically, the signal output circuit 1021$_2$ includes the output terminal 1021P$_2$ configured to output the differential signal P2 and the output terminal 1021N$_2$ configured to output the differential signal N2. Those plurality of signal output circuits 1021$_1$ and 1021$_2$ have the same circuit configuration.

The signal input circuit 1031$_1$ includes a pair of input terminals 1031P$_1$ and 1031N$_1$ configured to input the pair of differential signals P1 and N1. Specifically, the signal input circuit 1031$_1$ includes the input terminal 1031P$_1$ configured to input the differential signal P1 and the input terminal 1031N$_1$ configured to input the differential signal N1.

Similarly, the signal input circuit 1031$_2$ includes a pair of input terminals 1031P$_2$ and 1031N$_2$ configured to input the pair of differential signals P2 and N2. Specifically, the signal input circuit 1031$_2$ includes the input terminal 1031P$_2$ configured to input the differential signal P2 and the input terminal 1031N$_2$ configured to input the differential signal N2. Those plurality of signal input circuits 1031$_1$ and 1031$_2$ have the same circuit configuration. Note that, the IC 1012 is a ball grid array (BGA) package, and the input terminals 1031P$_1$, 1031N$_1$, 1031P$_2$, and 1031N$_2$ represent circular lands.

A plurality of differential signal line pairs each serving as transmission paths for a pair of differential signals are formed on the printed wiring board 1001 in parallel to each other. Ends of each differential signal line pair on one side in the wiring direction are connected to the pair of output terminals, and ends thereof on the other side in the wiring direction are connected to the pair of input terminals.

Specifically, a plurality of (two in the fifth embodiment) differential signal line pairs 1040$_1$ and 1040$_2$ are formed on the printed wiring board 1001 in parallel to each other with an interval therebetween in a direction orthogonal to the wiring direction. The differential signal line pair 1040$_1$ includes a differential signal line 1040P$_1$ serving as a transmission path for the positive differential signal P1 and a differential signal line 1040N$_1$ serving as a transmission path for the negative differential signal N1. The differential signal line pair 1040$_2$ includes a differential signal line 1040P$_2$ serving as a transmission path for the positive differential signal P2 and a differential signal line 1040N$_2$ serving as a transmission path for the negative differential signal N2. The differential signal line 1040P$_1$ and the differential signal line 1040N$_1$ are arranged adjacent to each other. The differential signal line 1040P$_2$ and the differential signal line 1040N$_2$ are arranged adjacent to each other.

A plurality of differential signal line pairs each serving as transmission paths for the pair of differential signals are formed in parallel on an internal package substrate of the IC 1012. Ends of the differential signal line pairs on one side in the wiring direction are connected to the pair of input terminals, and ends thereof on the other side in the wiring direction are connected to a semiconductor chip (die) serving as the pair of signal input circuits.

Specifically, a plurality of (two in the fifth embodiment) differential signal line pairs 1030$_1$ and 1030$_2$ are formed in parallel on the internal package substrate of the IC 1012 so as to be spaced apart from each other in the direction orthogonal to the wiring direction. The differential signal line pair 1030$_1$ includes a differential signal line 1030P$_1$ serving as a transmission path for the positive differential signal P1 and a differential signal line 1030N$_1$ serving as a transmission path for the negative differential signal N1. The differential signal line pair 1030$_2$ includes a differential signal line 1030P$_2$ serving as a transmission path for the positive differential signal P2 and a differential signal line 1030N$_2$ serving as a transmission path for the negative differential signal N2. The differential signal line 1030P$_1$ and the differential signal line 1030N$_1$ are arranged adjacent to each other. The differential signal line 1030P$_2$ and the differential signal line 1030N$_2$ are arranged adjacent to each other.

The differential signal line 1040P$_1$ includes a land 1041P$_1$, a signal pattern 1042P$_1$, and a land 1043P$_1$. The land 1041P$_1$ is a conductor which is formed on the surface layer 1001A and to which the output terminal 1021P$_1$ is joined by solder or the like. The land 1041P$_1$ corresponds to one end of the differential signal line 1040P$_1$ in the wiring direction. The land 1043P$_1$ is a conductor which is formed on the surface layer 1001A and to which the input terminal 1031P$_1$ is joined by solder or the like. The land 1043P$_1$ corresponds to the other end of the differential signal line 1040P$_1$ in the wiring direction. The signal pattern 1042P$_1$ is a conductor formed on the surface layer 1001A, and electrically connects the land 1041P$_1$ and the land 1043P$_1$ to each other.

The differential signal line 1030P$_1$ includes a land 1031P$_1$, a signal pattern 1032P$_1$, and a chip end 1033P$_1$. The land 1031P$_1$ is a conductor which is formed in the IC 1012 on the surface layer 1001A side of the printed wiring board and to which the land 1043P$_1$ of the printed wiring board is joined by solder or the like. The land 1031P$_1$ corresponds to one end of the differential signal line 1030P$_1$ in the wiring direction. The other end of the differential signal line 1030P$_1$ in the wiring direction is connected to a positive chip end 1033P$_1$ of the differential pair of the signal input circuit 1031$_1$ formed in the semiconductor chip of the IC 1012.

The differential signal line 1040N$_1$ includes a land 1041N$_1$, a signal pattern 1042N$_1$, and a land 1043N$_1$. The land 1041N$_1$ is a conductor which is formed on the surface layer 1001A and to which the output terminal 1021N$_1$ is joined by solder or the like. The land 1041N$_1$ corresponds to one end of the differential signal line 1040N$_1$ in the wiring direction. The land 1043N$_1$ is a conductor which is formed on the surface layer 1001A and to which the input terminal 1031N$_1$ is joined by solder or the like. The land 1043N$_1$ corresponds to the other end of the differential signal line 1040N$_1$ in the wiring direction. The signal pattern 1042N$_1$ is a conductor formed on the surface layer $1001A$, and electrically connects the land $1041N_1$ and the land $1043N_1$ to each other.

The differential signal line $1030N_1$ includes a land $1031N_1$, a signal pattern $1032N_1$, and a chip end $1033N_1$. The land $1031N_1$ is a conductor which is formed in the IC $1012$ on the surface layer $1001A$ side of the printed wiring board and to which the land $1043N_1$ of the printed wiring board is joined by solder or the like. The land $1031N_1$ corresponds to one end of the differential signal line $1030N_1$ in the wiring direction. The other end of the differential signal line $1030N_1$ in the wiring direction is connected to the negative chip end $1033N_1$ of the differential pair of the signal input circuit $1031_1$ formed in the semiconductor chip of the IC $1012$.

The differential signal line $1040P_2$ includes a land $1041P_2$, a signal pattern $1042P_2$, and a land $1043P_2$. The land $1041P_2$ is a conductor which is formed on the surface layer $1001A$ and to which the output terminal $1021P_2$ is joined by solder or the like. The land $1041P_2$ corresponds to one end of the differential signal line $1040P_2$ in the wiring direction. The land $1043P_2$ is a conductor which is formed on the surface layer $1001A$ and to which the input terminal $1031P_2$ is joined by solder or the like. The land $1043P_2$ corresponds to the other end of the differential signal line $1040P_2$ in the wiring direction. The signal pattern $1042P_2$ is a conductor formed on the surface layer $1001A$, and electrically connects the land $1041P_2$ and the land $1043P_2$ to each other.

The differential signal line $1030P_2$ includes a land $1031P_2$, a signal pattern $1032P_2$, and a chip end $1033P_2$. The land $1031P_2$ is a conductor which is formed in the IC $1012$ on the surface layer $1001A$ side of the printed wiring board and to which the land $1043P_2$ of the printed wiring board is joined by solder or the like. The land $1031P_2$ corresponds to one end of the differential signal line $1030P_2$ in the wiring direction. The other end of the differential signal line $1030P_2$ in the wiring direction is connected to a positive chip end $1033P_2$ of the differential pair of the signal input circuit $1031_2$ formed in the semiconductor chip of the IC $1012$.

The differential signal line $1040N_2$ includes a land $1041N_2$, a signal pattern $1042N_2$, and a land $1043N_2$. The land $1041N_2$ is a conductor which is formed on the surface layer $1001A$ and to which the output terminal $1021N_2$ is joined by solder or the like. The land $1041N_2$ corresponds to one end of the differential signal line $1040N_2$ in the wiring direction. The land $1043N_2$ is a conductor which is formed on the surface layer $1001A$ and to which the input terminal $1031N_2$ is joined by solder or the like. The land $1043N_2$ corresponds to the other end of the differential signal line $1040N_2$ in the wiring direction. The signal pattern $1042N_2$ is a conductor formed on the surface layer $1001A$, and electrically connects the land $1041N_2$ and the land $1043N_2$ to each other.

The differential signal line $1030N_2$ includes a land $1031N_2$, a signal pattern $1032N_2$, and a chip end $1033N_2$. The land $1031N_2$ is a conductor which is formed in the IC $1012$ on the surface layer $1001A$ side of the printed wiring board and to which the land $1043N_2$ of the printed wiring board is joined by solder or the like. The land $1031N_2$ corresponds to one end of the differential signal line $1030N_2$ in the wiring direction. The other end of the differential signal line $1030N_2$ in the wiring direction is connected to the negative chip end $1033N_2$ of the differential pair of the signal input circuit $1031_2$ formed in the semiconductor chip of the IC $1012$.

The land $1043P_1$ and the output terminal $1031P_1$ are connected to each other with use of a conductive joining member such as solder, to thereby electrically connect the differential signal line $1040P_1$ and the differential signal line $1030P_1$ to each other. The land $1043N_1$ and the output terminal $1031N_1$ are connected to each other with use of a conductive joining member such as solder, to thereby electrically connect the differential signal line $1040N_1$ and the differential signal line $1030N_1$ to each other. The land $1043P_2$ and the output terminal $1031P_2$ are connected to each other with use of a conductive joining member such as solder, to thereby electrically connect the differential signal line $1040P_2$ and the differential signal line $1030P_2$ to each other. The land $1043N_2$ and the output terminal $1031N_2$ are connected to each other with use of a conductive joining member such as solder, to thereby electrically connect the differential signal line $1040N_2$ and the differential signal line $1030N_2$ to each other.

As described above, the two adjacent differential signal line pairs $1040_1$ and $1040_2$ arranged on the surface layer $1001A$ of the printed wiring board are electrically connected to the two adjacent differential signal line pairs $1030_1$ and $1030_2$ arranged on the internal package substrate of the IC $1012$, respectively. Specifically, the differential signal lines $1040P_1$, $1040N_1$, $1040P_2$, and $1040N_2$ are electrically connected to the differential signal lines $1030P_1$, $1030N_1$, $1030P_2$, and $1030N_2$, respectively.

The two differential signal line pairs $1040_1$ and $1040_2$ are arranged adjacent to each other. Similarly, the two differential signal line pairs $1030_1$ and $1030_2$ are arranged adjacent to each other. In the fifth embodiment, no other conductors such as ground lines and power supply lines are interposed between the two adjacent differential signal line pairs $1040_1$ and $1040_2$ and between the two adjacent differential signal line pairs $1030_1$ and $1030_2$.

Further, no other conductors such as ground lines and power supply lines are interposed between the adjacent differential signal line $1040P_1$ and differential signal line $1040N_1$ and between the adjacent differential signal line $1040P_2$ and differential signal line $1040N_2$. Similarly, no other conductors such as ground lines and power supply lines are interposed between the adjacent differential signal line $1030P_1$ and differential signal line $1030N_1$ and between the adjacent differential signal line $1030P_2$ and differential signal line $1030N_2$.

In the fifth embodiment, the differential signal line pair $1040_1$ ($1040_2$) and the differential signal line pair $1030_1$ ($1030_2$) are wired to have a relative arrangement in which the differential signal line pair $1040_1$ ($1040_2$) and the differential signal line pair $1030_1$ ($1030_2$) cross with each other. Specifically, the differential signal line pair $1040_1$ ($1040_2$) and the differential signal line pair $1030_1$ ($1030_2$) are wired so that the order of arrangement of one differential signal line $1040P_1$ ($1040P_2$) and the other differential signal line $1040N_1$ ($1040N_2$) is different from the order of arrangement of one differential signal line $1030P_1$ ($1030P_2$) and the other differential signal line $1030N_1$ ($1030N_2$). In other words, the positive and negative signal lines of the differential signal line $1040_1$ and the positive and negative signal lines of the differential signal line $1030_1$ cross with each other, and the positive and negative signal lines of the differential signal line $1040_2$ and the positive and negative signal lines of the differential signal line $1030_2$ cross with each other.

Specifically, the signal patterns are arranged on the surface layer $1001A$ of the printed wiring board in the order of the negative signal pattern $1042N_1$, the positive signal pattern $1042P_1$, the positive signal pattern $1042P_2$, and the negative signal pattern $1042N_2$. The signal patterns are arranged on the internal package substrate of the IC 1021 in the order of the positive signal pattern $1032P_1$, the negative signal pattern $1032N_1$, the negative signal pattern $1032N_2$, and the positive signal pattern $1032P_2$. In other words, the order of arrangement of the positive and negative wiring in the signal patterns $1032P_1$, $1032N_1$, $1032P_2$, and $1032N_2$ is different from the order of arrangement of the positive and negative wiring in the signal patterns $1042P_1$, $1042N_1$, $1042P_2$, and $1042N_2$.

In other words, on the surface layer 1001A of the printed wiring board, the positive signal line $1040P_1$ in the differential signal line pair $1040_1$ and the positive signal line $1040P_2$ in the differential signal line pair $1040_2$ are opposed to each other. Further, on the internal package substrate of the IC 1021, the positive signal line $1030P_1$ in the differential signal line pair $1030_1$ and the positive signal line $1030P_2$ in the differential signal line pair $1030_2$ are opposed to each other.

In this manner, in the fifth embodiment, the lands $1043P_1$ and $1043N_1$ and the lands $1043P_2$ and $1043N_2$ each serve as the region in which the differential signal lines have the relative arrangement of crossing with each other in the direction orthogonal to the wiring direction. Specifically, the differential signal line pair $1040_1$ ($1040_2$) is wired to have a relative arrangement in which one differential signal line $1040P_1$ ($1040P_2$) and the other differential signal line $1040N_1$ ($1040N_2$) cross with each other relative to the differential signal line pair $1030_1$ ($1030_2$).

With the above-mentioned configuration, crosstalk in antiphase to crosstalk superimposed onto the positive signal line on the printed wiring board is superimposed onto the negative signal line on the internal package substrate of the IC 1012. Consequently, in regard to the differential signals flowing through the respective differential signal lines, the slew rates of the positive signal and the negative signal are made close to each other, to thereby reduce the variation amount of the crossing voltage of the pair of differential signals. In addition, there is no need to form a member for rearranging the wiring, such as a signal via or a chip component, in the printed wiring board, and hence the printed wiring board can be designed to have a small footprint. Besides, signal reflection caused by impedance mismatch between the signal pattern and the signal via can be suppressed.

Further, as illustrated in FIG. 6, the wiring width and the wiring interval on the internal package substrate of the IC are generally finer than the wiring pattern width and the wiring interval on the printed wiring board. Thus, the amount of crosstalk per unit length is larger in the wiring of the internal package substrate of the IC 1012 than in the wiring of the printed wiring board 1001. For this reason, when the wiring lengths of the signal patterns $1042P_1$ and $1042P_2$, which are the wiring portions arranged adjacent to each other on the positive side, are set to be longer than the wiring lengths of the signal patterns $1032N_1$ and $1032N_2$, which are the wiring portions arranged adjacent to each other on the negative side, the variation amount of the crossing voltage can be further reduced. In addition, in order to reduce the variation amount of the crossing voltage, it is preferred to design the printed wiring board in consideration of the electrical length in addition to the physical length.

Further, in the fifth embodiment, the output terminals $1031P_1$, $1031N_1$, $1031P_2$, and $1031N_2$ of the IC 1012 are arranged in a grid of 2×2 rows. Then, the lands $1043P_1$ and $1043N_1$ and the lands $1043P_2$ and $1043N_2$ of the printed wiring board 1001 are also arranged in a grid of 2×2 rows in order to be electrically joined to the output terminals of the IC 1012. As a result, one of the positive wiring and the negative wiring (in the case of FIG. 6, signal patterns $1042N_1$ and $1042N_2$) can be wired to the inner side of the output terminal in the second row, and hence the region (area) for interchanging the relative arrangements can be reduced in size as compared to when the output terminals are arranged in a single row. Consequently, the influence of impedance mismatch caused by loss of differential properties between positive and negative signals can be reduced to reduce the variation amount of the crossing voltage.

Note that, in FIG. 6, the wiring is rearranged at the conductive connection part between the IC 1012 and the printed wiring board 1001, but when the crosstalk in the IC 1011 is a concern, the wiring may be rearranged at a conductive connection part between the IC 1011 and the printed wiring board 1001. Further, the wiring may be rearranged at both of the conductive connection part between the IC 1012 and the printed wiring board 1001 and the conductive connection part between the IC 1011 and the printed wiring board 1001.

Further, by matching the impedance between the wiring of the printed wiring board 1001 and the wiring of the package substrates of the IC 1011 and the IC 1012 as much as possible, the influence of signal reflection can be reduced, and the effect of reducing the variation amount of the crossing voltage due to the crosstalk of the present invention is more strongly exhibited.

The IC 1011 and the IC 1012 are not necessarily required to have a package substrate, and may be a quad flat package (QFP), a quad flat non-leaded package (QFN), or the like. In other words, the concept of the present invention can be diverted to a lead frame having no substrate inside the package.

EXAMPLES

Example 1

A printed circuit board of Example 1 is now described. In the configuration of the printed circuit board 100 illustrated in FIG. 1, the conditions of the printed wiring board 101 are designed as follows. The printed wiring board 101 is a four-layer board having a thickness of 1.0 mm. The thickness of copper foil is set to be 36 µm, and a resist layer covering the copper foil is set to be 20 µm. Further, the thickness of prepreg (FR-4) layer between the copper foil as the surface layer and the copper foil as the internal layer is set to be 100 µm.

The wiring widths of the signal patterns $142P_1$, $142N_1$, $142P_2$, and $142N_2$ are all set to be 150 µm, and the intervals between the signal patterns $142P_1$, $142N_1$, $142P_2$, and $142N_2$ in the direction orthogonal to the wiring direction are all set to be 180 µm. The lengths of the signal patterns $142P_1$, $142N_1$, $142P_2$, and $142N_2$ are set to be 50 mm for a shorter one of the positive and negative signal patterns, and the wiring length difference between the positive and negative signal patterns is set to be 0.5 mm. The total wiring lengths are the same between the positive and negative signal patterns. Specifically, as illustrated in FIG. 1, the differential signal line pair $140_1$ had the wiring structure in which the positive signal pattern $142P_1$ is longer than the negative signal pattern $142N_1$ by 0.5 mm. Further, the differential signal line pair $140_1$ had the wiring structure in which the negative signal pattern $144N_1$ is longer than the positive signal pattern $144P_1$ by 0.5 mm. The relative permittivity of the resist is set to be 3.5, and the relative permittivity of the prepreg is set to be 4.6. The characteristic impedance Z0 and the differential impedance Zdiff of the wiring under those conditions are calculated as 48.3Ω and 84.6Ω, respectively. A buffer of 34Ω is used at the output of the IC 111 mounted on the printed wiring board 101, and a buffer terminated at 40Ω is used at the input of the IC 112. Note that, the termination potential is set to be half of the power supply voltage. In regard to the signal vias 143P$_1$, 143N$_1$, 143P$_2$, and 143N$_2$, the hole diameter is set to be 0.25 mm, the plated thickness at the via hole internal circumference is set to be 20 μm, the land diameter is set to be 0.55 mm, and the clearance diameter of the land outer circumference is set to be 0.8 mm. Under those conditions, the characteristic impedance Z0 of the signal vias is calculated as 38.4Ω.

Figure 7:
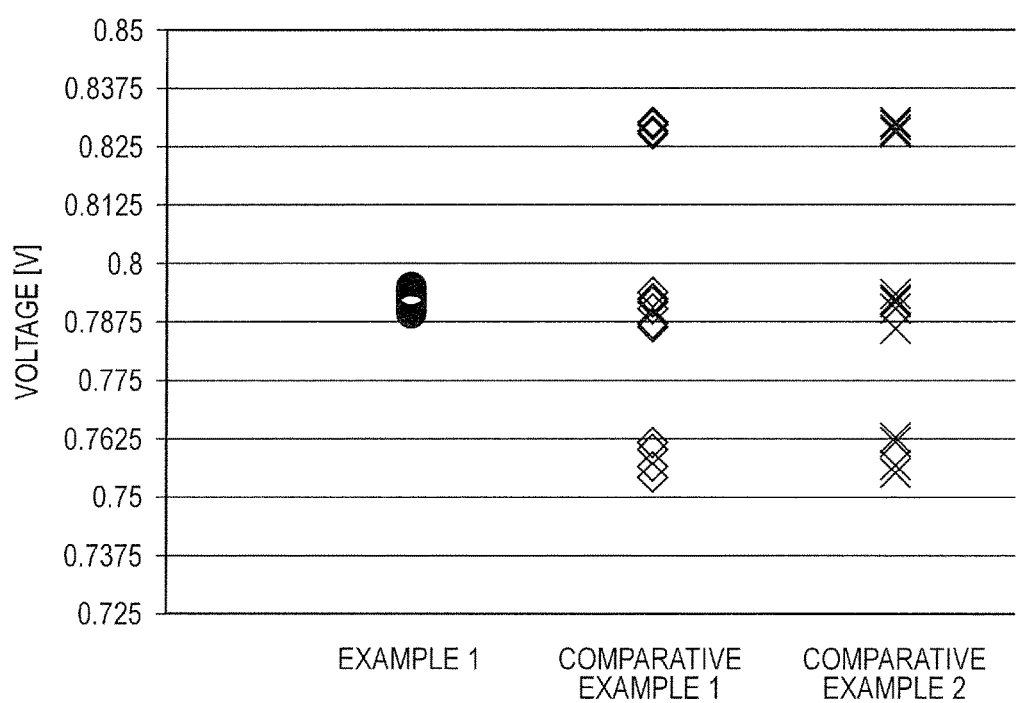
FIG. 7 is a graph for illustrating simulation results of a crossing voltage in Example 1 and Comparative Examples 1 and 2.

FIG. 7 is a graph for illustrating simulation results of the crossing voltage in Example 1 and Comparative Examples 1 and 2. The power supply voltage supplied to the IC 111 and the IC 112 is set to be 1.575 V. This value of the power supply voltage is based on the DDR3 interface JEDEC standard, and is the voltage condition under which the slew rate is maximized. Then, the crossing voltage of the positive and negative differential signals input to the IC 112 when the IC 111 output the signals is determined by transmission line simulation. An output pulse used for the IC 111 is a pulse pattern of PRBS2^7-1 defined by ITU-T Recommendations O.150 and O.151, which is generally used by measurement instrument manufacturers, and the frequency of the output pulse is set to be 400 MHz on the assumption of an operation speed of 800 Mbps. The rise/fall time of the signals input to the IC 112 is 150 ps when no crosstalk is superimposed. The variation amount of the crossing voltage of the differential signals under those conditions in Example (variation amount with reference to a reference potential of 0.7875 V, which is half of the power supply voltage) is estimated. The results are plotted in FIG. 7 with symbols "○". Note that, the symbols "○" plotted in FIG. 7 are illustrated in an overlapping manner.

Figure 8A:
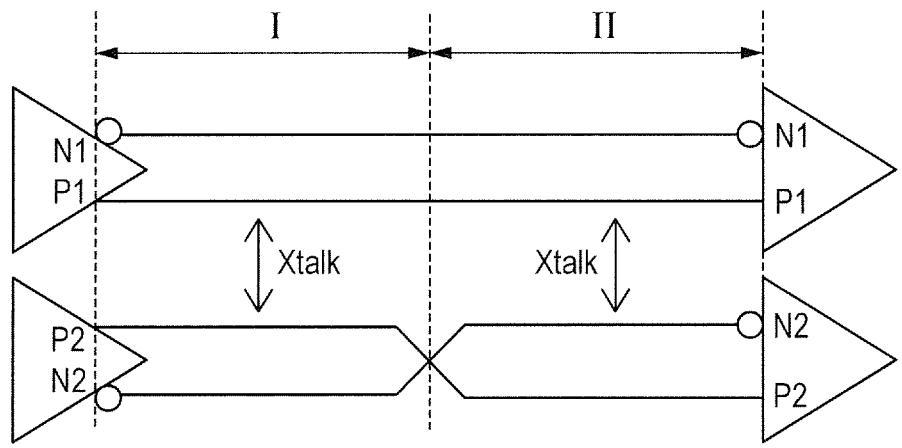
FIG. 8A is a schematic diagram for illustrating the wiring structures of printed circuit boards of Comparative Example 1.
Figure 8B:
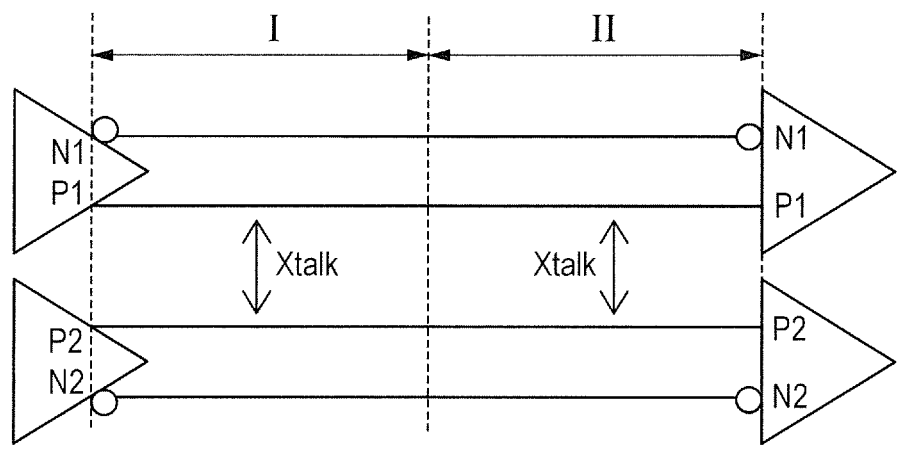
FIG. 8B is a schematic diagram for illustrating the wiring structures of printed circuit boards of Comparative Example 2.

FIG. 8A and FIG. 8B are schematic diagrams for illustrating the wiring structure of the printed circuit boards of Comparative Examples 1 and 2. FIG. 8A is an illustration of Comparative Example 1, and FIG. 8B is an illustration of Comparative Example 2.

Comparative Example 1

The printed circuit board of Comparative Example 1 has substantially the same structure as in Example 1, but differs from Example 1 in that the order of arrangement of the positive and negative wirings is not changed through signal vias in one of the two pairs of differential signal lines.

Specifically, as illustrated in FIG. 8A, the differential signal lines in which the order of arrangement of the positive and negative wirings is not inverted in the middle of the path and the differential signal lines in which the order of arrangement of the positive and negative wirings is inverted in the middle of the path are adjacent to each other. The variation amount of the crossing voltage of the differential signals under those conditions in Comparative Example 1 is estimated by simulation. The results are plotted in FIG. 7 with symbols "◇". Note that, the symbols "◇" plotted in FIG. 7 are illustrated in an overlapping manner.

Comparative Example 2

In Comparative Example 2, no signal via hole is formed, and two ICs are mounted on the same surface and connected by wiring. Accordingly, no wiring rearranging portion for rearranging the wiring is formed, and no difference occurs between the positive and negative wiring lengths. Other conditions for the boards and the wiring are the same as in Example 1. The variation amount of the crossing voltage of the differential signals under those conditions in Comparative Example 2 is estimated by simulation. The results are plotted in FIG. 7 with symbols "x". Note that, the symbols "x" plotted in FIG. 7 are illustrated in an overlapping manner.

Referring to FIG. 7, how the variation amount of the crossing voltage changes depending on the configuration of the two differential signal line pairs can be compared between Example 1 and Comparative Examples 1 and 2.

In Example 1, the maximum value and the minimum value of the crossing voltage are 0.795 V and 0.790 V, respectively, and the maximum value of the variation amount of the crossing voltage is about 7 mV. In Comparative Example 1, the maximum value and the minimum value of the crossing voltage are 0.830 V and 0.754 V, respectively, and the maximum value of the variation amount of the crossing voltage is about 43 mV. In Comparative Example 2, the maximum value and the minimum value of the crossing voltage are 0.830 V and 0.755 V, respectively, and the maximum value of the variation amount of the crossing voltage is about 42 mV. In other words, the simulations indicate that the variation amount of the crossing voltage can be reduced most when the differential signal lines are arranged based on the configuration of Example 1.

In Example 1, the wiring rearranging portions are formed for both of the two differential signal line pairs. Thus, the crosstalk superimposed from the signal pattern 144N$_2$ to the signal pattern 144N$_1$ is in antiphase to the crosstalk superimposed from the signal pattern 142P$_2$ to the signal pattern 142P$_1$. Further, the crosstalk superimposed from the signal pattern 144N$_1$ to the signal pattern 144N$_2$ is in antiphase to the crosstalk superimposed from the signal pattern 142P$_1$ to the signal pattern 142P$_2$. Accordingly, in regard to the signals flowing through the signal patterns 144P$_1$, 144N$_1$, 144P$_2$, and 144N$_2$, the amounts of crosstalk affecting the slew rates of the positive signal and the negative signal at the receiver end are approximated to each other between the positive side and the negative side. Consequently, the variation amount of the crossing voltage of the differential signals is reduced.

In Comparative Example 1, on the other hand, as illustrated in FIG. 8A, a differential signal line pair in which the order of arrangement of positive and negative wirings is not inverted at the middle of the path and a differential signal line pair in which the order of arrangement of positive and negative wirings is inverted at the middle of the path are adjacent to each other. In one differential signal line pair and the other differential signal line pair, crosstalk is superimposed therebetween in the section I from the driver to the middle point of the one differential signal line pair and from the driver to the wiring rearranging portion of the other differential signal line pair. In the one differential signal line pair and the other differential signal line pair, crosstalk in antiphase to that in the section I is superimposed therebetween in the section II from the middle point of the one differential signal line pair to the receiver and from the wiring rearranging portion of the other differential signal line pair to the receiver. Thus, the crosstalk superimposed in the section I and the crosstalk superimposed in the section II are canceled with each other at the receiver end, to thereby reduce the variation amount of the crossing voltage.

Figure 9:
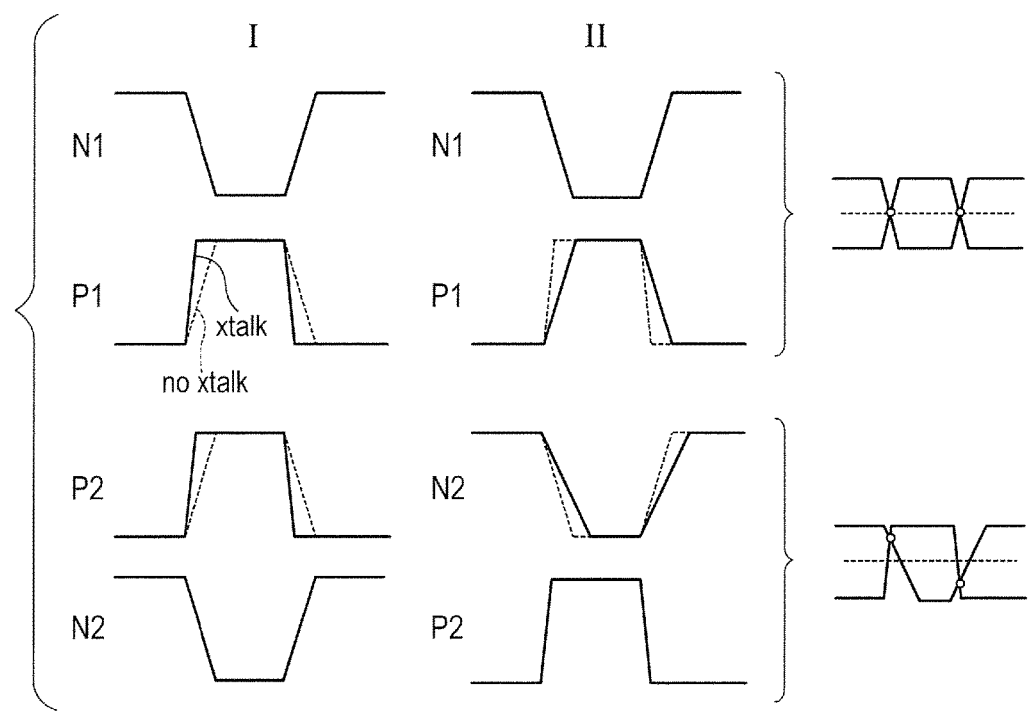
FIG. 9 is a waveform diagram of respective signals in the printed circuit board of Comparative Example 1.

On the other hand, crosstalk superimposed from the one differential signal line pair onto the other differential signal line pair is now considered. FIG. 9 is a waveform diagram of the respective signals P1, N1, P2, and N2 in the printed circuit board of Comparative Example 1.

As illustrated in FIG. 9, common-mode crosstalk is superimposed from the positive signal line of one differential signal line pair onto the adjacent positive signal line of the other differential signal line pair. Differential-mode crosstalk is superimposed from the positive signal line of the one differential signal line pair onto the adjacent negative signal line of the other differential signal line pair. Thus, the difference in slew rate of the signals propagating through the positive signal line and the negative signal line in the other differential signal line pair is increased at the receiver end. Accordingly, the crosstalk is superimposed from the differential signals in which the order of arrangement of the wiring is not inverted to the differential signals in which the order of arrangement of the wiring is inverted so that the crosstalk in phase to the crosstalk superimposed on the positive wiring of the differential signals in which the order of wiring is inverted is superimposed on the negative wiring. Accordingly, the difference in slew rate between the positive and negative signals is increased to greatly vary the crossing voltage.

In Comparative Example 2, the crosstalk is superimposed mainly onto one signal line of the positive and negative signal lines, and hence the slew rate is different between the positive and negative signals, resulting in a great variation in crossing voltage.

Consequently, in Example 1 where the variation amount of the crossing voltage is lower, the positive and negative signals can cross with each other around the threshold voltage defining the timing, and hence a signal malfunction is less liable to occur.

As described above, the respective differential signal lines are wired to be rearranged so that the crosstalk equally affects the respective differential signal lines in the two differential signal line pairs, and hence the variation amount of the crossing voltage of each pair of differential signals is reduced.

Example 2

A printed circuit board of Example 2 is described. The printed circuit board of Example 2 had substantially the same configuration as in Example 1, but is different from Example 1 in that the positions of the signal vias $143P_1$, $143N_1$, $143P_2$, and $143N_2$ of FIG. 1 are variously changed. Specific implementation conditions are as follows.

In the differential signal line pair extending from the driver, a shorter length of the wiring from the driver to the wiring rearranging portion (in the case of FIG. 1, $142N_1$ and $142N_2$) is represented by X. Further, in the differential signal line pair, a shorter length of the wiring from the receiver to the wiring rearranging portion (in the case of FIG. 1, $144P_1$ and $144P_2$) is represented by Y. In this case, X and Y are changed from 0.1 mm to 99.9 mm, but are designed so that the sum of the lengths X and Y is 100 mm. Further, the wiring length difference between the positive side and the negative side is set to be 0.5 mm, but the total wiring lengths are set to be equal between the positive side and the negative side. Note that, the printed circuit board is designed so that the regions in which the arrangements of the two adjacent differential signal line pairs $140_1$ and $140_2$ cross with each other are line-symmetrically to the center line $C_1$ passing along the wiring direction between the two differential signal line pairs $140_1$ and $140_2$.

Figure 10:
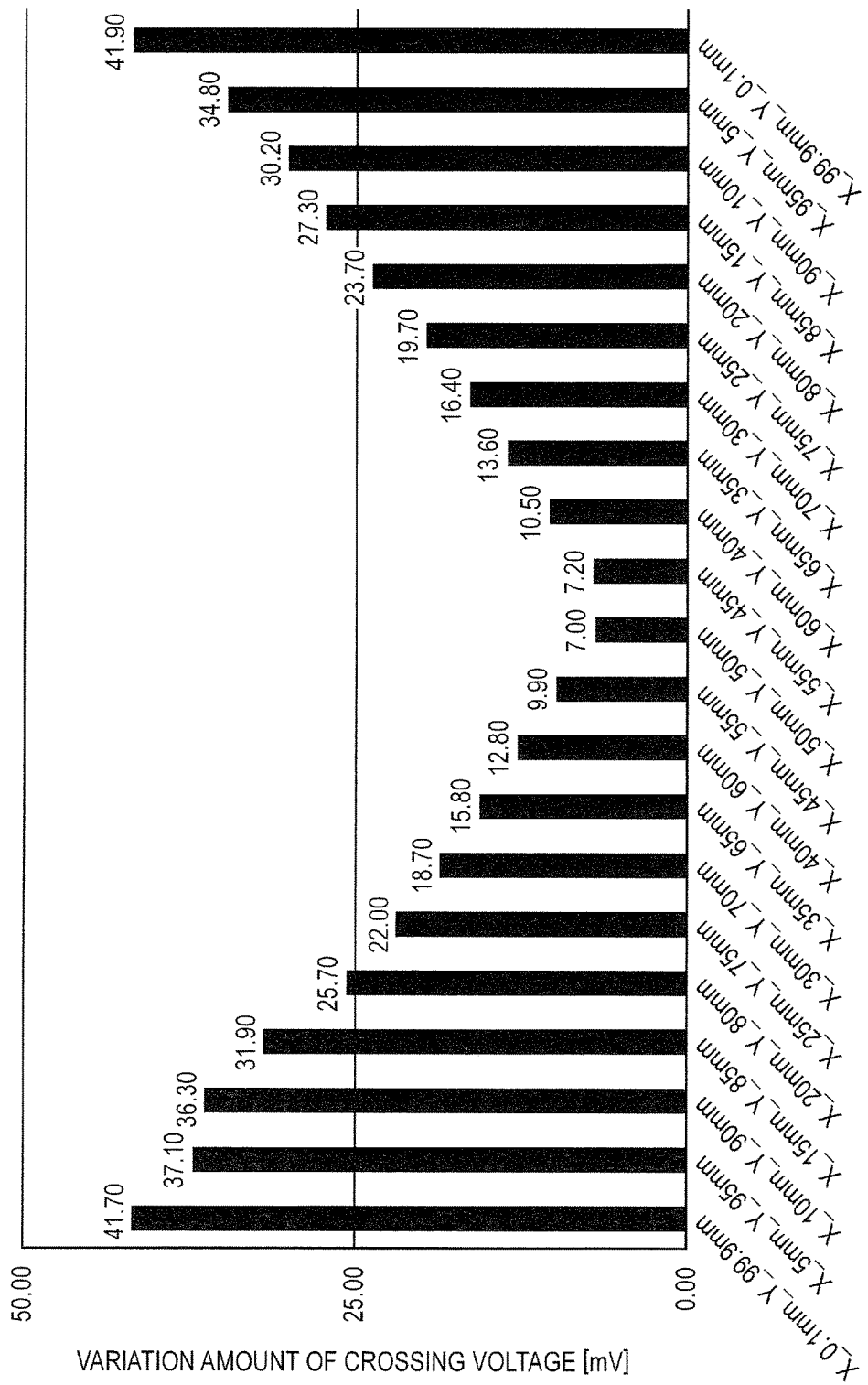
FIG. 10 is a graph for illustrating simulation results of a crossing voltage in Example 2.

FIG. 10 is a graph for illustrating simulation results of the crossing voltage in Example 2. Conditions of the transmission line simulation are the same as those described in Example 1, and the variation amount of the crossing voltage of the differential signals is estimated. The results are illustrated in the form of a bar graph in FIG. 10.

FIG. 10 illustrates that the variation amount of the crossing voltage becomes smaller as the difference between the lengths X and Y becomes smaller. Specifically, the variation amount of the crossing voltage is reduced as the amount of the antiphase crosstalk superimposed from the signal pattern $144N_2$ onto the signal pattern $144N_1$ becomes closer to the amount of the crosstalk superimposed from the signal pattern $142P_2$ onto the signal pattern $142P_1$. Thus, it is desired to wire the wiring so that the respective wiring lengths along which the positive and negative wiring in one differential signal line pair and the positive and negative wiring in the other adjacent differential signal line pair are arranged adjacent to each other are equal to each other.

Note that, when the printed circuit board is applied to differential signal lines for a DDR3 memory interface, the variation amount (Vix) of the crossing voltage is defined as 150 mV according to JEDEC. It is assumed that the variation (output phase difference between positive and negative, and wiring length difference in IC package) in the crossing voltage in an IC such as a memory controller is 125 mV, the permissible variation amount of the crossing voltage in the printed wiring board is 25 mV. FIG. 10 illustrates that the effect is sufficiently exhibited even when the lengths X and Y are not equal to each other, specifically, even when there is a difference of 25 mm (about 25% of the total wiring length). In practice, the permissible value of the variation amount of the crossing voltage changes depending on the type of differential interface and the performance of an input/output IC (signal slew rate or phase difference between positive and negative). In order to obtain a sufficient level of the effect, it is desired to design the lengths X and Y so as to satisfy the above mathematical expression 2.

Example 3

A printed circuit board of Example 3 is described. The printed circuit board of Example 3 has substantially the same configuration as in Example 2, but differs from Example 2 in the following points. Assuming higher-density wiring than in Example 2, the wiring widths of the signal patterns $1042P_1$, $1042N_1$, $1042P_2$, and $1042N_2$ are all set to be 125 μm. Further, the intervals between the signal patterns $1042P_1$, $1042N_1$, $1042P_2$, and $1042N_2$ in the direction orthogonal to the wiring direction are all set to be 125 μm. In addition, in order to generate crosstalk also in the internal package substrates of the IC 1011 and the IC 1012, the internal package substrates of the IC 1011 and the IC 1012 are designed so that the wiring widths of the signal patterns are 45 μm and the intervals between the signal patterns in the direction orthogonal to the wiring direction are all 55 μm.

In one differential signal line pair extending from the driver, a shorter length of the wiring from the driver to the wiring rearranging portion (in the case of FIG. 1, $142N_1$ and $142N_2$) is represented by X. Further, in the one differential signal line pair, a shorter length of the wiring from the receiver to the wiring rearranging portion (in the case of FIG. 1, $144P_1$ and $144P_2$) is represented by Y. In this case, X and Y are changed from 2 mm to 18 mm, but are designed so that the sum of the lengths X and Y is 20 mm. The wiring length difference between the positive side and the negative side is set to be 0.5 mm, but the total wiring lengths are set to be equal between the positive side and the negative side. Note that, the printed circuit board is designed so that the regions in which the arrangements of the two adjacent differential signal line pairs $140_1$ and $140_2$ cross with each other are line-symmetrically to the center line $C_1$ passing along the wiring direction between the two differential signal line pairs $140_1$ and $140_2$.

The lengths of the signal patterns of the IC 1011 are set to be 5 mm for both of the positive and negative signal patterns, and the lengths of the signal patterns of the IC 1012 are set to be 10 mm for both of the positive and negative signal patterns.

The layer structure of each of the internal package substrates of the ICs 1011 and 1012 is, similarly to the printed wiring board 1001, a four-layer board having a thickness of 1.0 mm, in which the thickness of copper foil is set to be 36 µm and the thickness of a resist layer covering the copper foil is set to be 20 µm. Further, the thickness of prepreg (FR-4) layer between the copper foil as the surface layer and the copper foil as the internal layer is set to be 100 µm. The relative permittivity of the resist is 3.5, and the relative permittivity of the prepreg is 4.6. The characteristic impedance Z0 and the differential impedance Zdiff of the wiring of the printed wiring board 1001 under those conditions are calculated as 52.0Ω and 84.5Ω, respectively. Further, the characteristic impedance Z0 and the differential impedance Zdiff of the wiring of the internal package substrates of the ICs 1011 and 1012 are calculated as 73.0Ω and 84.8Ω, respectively. A buffer of 34Ω is used at the output of the IC 1011 mounted on the printed wiring board 1001, and a buffer terminated at 40Ω is used at the input of the IC 1012. Note that, the termination potential is half of the power supply voltage.

FIG. 11 is a graph for illustrating simulation results of the crossing voltage in Example 3 and Example 4 described below. Conditions of the transmission line simulation are the same as those described in Example 1, and the variation amount of the crossing voltage of the differential signals is estimated. The results are illustrated in the form of a bar graph in FIG. 11.

Example 4

A printed circuit board according to Example 4 of the present invention is now described. The printed circuit board of Example 4 has substantially the same configuration as in Example 3, but differs in that the signal patterns are rearranged at a conductive connection part between the printed wiring board 1001 and the IC 1012 as exemplified by the configuration of the printed circuit board 1000 illustrated in FIG. 6.

The lengths of the signal patterns $1042P_1$, $1042N_1$, $1042P_2$, and $1042N_2$ are set to be 20 mm for a shorter one of the positive and negative signal patterns, and the wiring length difference between the positive and negative signal patterns is set to be 1.1 mm on the assumption of a BGA having a pitch of 0.8 mm. The wiring widths of the signal patterns $1032P_1$, $1032N_1$, $1032P_2$, and $1032N_2$ of the IC 1012 are all set to be 45 µm on the assumption of higher-density wiring than the printed wiring board 1001. Further, the intervals between the signal patterns $1032P_1$, $1032N_1$, $1032P_2$, and $1032N_2$ in the direction orthogonal to the wiring direction are all set to be 55 µm. The lengths of the signal patterns $1032P_1$, $1032N_1$, $1032P_2$, and $1032N_2$ are set to be 10 mm for a shorter one of the positive and negative signal patterns, and the wiring length difference between the positive and negative signal patterns is set to be 1.1 mm. Further, the wiring widths and the wiring intervals of the signal patterns of the IC 1011 are set to be the same as those of the IC 1012, and the lengths of the signal patterns of the IC 1011 are set to be 5 mm for both of the positive and negative signal patterns. As a result, the total wiring length of the differential signal line $1040_1$ or $1040_2$ and the differential signal line $1030_1$ or $1030_2$ of the printed wiring board 1001 is set to be the same for the positive and negative differential signal lines. In other words, as illustrated in FIG. 6, the differential signal line $1040_1$ had the wiring structure in which the negative signal pattern $1042N_1$ is longer than the positive signal pattern $1042P_1$ by 1.1 mm. Further, the differential signal line $1030_1$ had the wiring structure in which the positive signal pattern $1030N_1$ is longer than the negative signal pattern $1030P_1$ by 1.1 mm. The relative permittivity of the resist is set to be 3.5, and the relative permittivity of the prepreg is set to be 4.6. The characteristic impedance Z0 and the differential impedance Zdiff of the wiring of the printed wiring board 1001 under those conditions are calculated as 52.0Ω and 84.5Ω, respectively. Further, the characteristics impedance Z0 and the differential impedance Zdiff of the wiring of the internal package substrates of the ICs 1011 and 1012 are calculated as 73.0Ω and 84.8Ω, respectively. A buffer of 34Ω is used at the output of the IC 1011 mounted on the printed wiring board 1001, and a buffer terminated at 40Ω is used at the input of the IC 1012. Note that, the termination potential is set to be half of the power supply voltage.

FIG. 11 is a graph for illustrating simulation results of the crossing voltage in Example 3 and Example 4. Conditions of the transmission line simulation are the same as those described in Example 1, and the variation amount of the crossing voltage of the differential signals is estimated. The results are illustrated in the form of a bar graph in FIG. 11.

From FIG. 11, it is understood that, when the crosstalk is generated in the internal package substrates of the IC 1011 and IC 1012, the variation amount of the crossing voltage can be reduced more as the wiring rearranging portion is positioned closer to the IC 1012 unlike FIG. 10. The reason is that the wiring width and the wiring interval on the internal package substrate of the IC 1012 are finer than the wiring pattern width and the wiring interval on the printed wiring board 1001. In other words, the reason is that the amount of crosstalk per unit length is larger in the wiring of the internal package substrate of the IC 1012 than in the wiring of the printed wiring board 1001. Further, the wiring of the internal package substrate of the IC 1012 is sufficiently long.

Thus, the wiring is wired so as to be rearranged at the connection part between the printed wiring board 1001 and the IC 1012 so that the crosstalk in antiphase to the crosstalk superimposed on the positive wiring of the differential signal lines is also superimposed on the negative wiring. In other words, the phase and amount of the crosstalk superimposed on the negative wiring arranged adjacent to each other on the internal package substrate of the IC 1012 are approximated to be opposite and equal to the crosstalk superimposed on the positive wiring arranged adjacent to each other on the printed wiring board 1001. As a result, the variation amount of the crossing voltage can be reduced.

Note that, the present invention is not limited to the embodiments described above. Various modifications can be made within the range of the technical idea of the present invention. For example, the present invention is not limited to the printed circuit board. The present invention can be applied to various differential transmission circuits having differential transmission lines crossing with each other.

According to the present invention, each differential signal line pair is wired to have a relative arrangement in which one differential signal line and the other differential signal line cross with each other in the middle in the wiring direction. Consequently, the slew rate of the positive signal and the slew rate of the negative signal are approximated to each other at the input terminals of each signal input unit, to thereby reduce the variation amount of the crossing voltage of the pair of differential signals received by each signal input unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-223999, filed Nov. 4, 2014 and Japanese Patent Application No. 2015-196419, filed Oct. 2, 2015 which are hereby incorporated by reference herein in their entirety.

The invention claimed is:

1. A printed circuit board, comprising:
a first semiconductor device configured to input and output a signal;
a second semiconductor device configured to input and output a signal; and
a printed wiring board having the first semiconductor device and the second semiconductor device mounted thereon, the printed wiring board comprising:
a first differential signal wiring formed of a pair of signal transmission lines, the first differential signal wiring connecting the first semiconductor device and the second semiconductor device to each other, wherein the pair of signal transmission lines forming the first differential signal wiring comprises a first signal transmission line and a second signal transmission line; and
a second differential signal wiring formed of a pair of signal transmission lines, the second differential signal wiring connecting the first semiconductor device and the second semiconductor device to each other and being arranged in parallel to the first differential signal wiring, the first differential signal wiring and the second differential signal wiring being arranged without any other differential wirings therebetween, wherein the pair of signal transmission lines forming the second differential signal wiring comprises a third signal transmission line and a fourth signal transmission line,
wherein the pair of signal transmission lines forming the first differential signal wiring are wired to have a relative arrangement in which, when viewed in plan from a direction perpendicular to a surface of the printed wiring board, the first signal transmission line and the second signal transmission line cross with each other at least once in the first differential signal wiring in a wiring direction thereof,
wherein the pair of signal transmission lines forming the second differential signal wiring are wired to have a relative arrangement in which, when viewed in plan from the direction perpendicular to the surface of the printed wiring board, the third signal transmission line and the fourth signal transmission line cross with each other at least once in the second differential signal wiring in a wiring direction thereof,
wherein the number of crossings of the pair of signal transmission lines forming the first differential signal wiring is equal to the number of crossings of the pair of signal transmission lines forming the second differential signal wiring, and
wherein each of the crossings of the pair of signal transmission lines forming the first differential signal wiring and corresponding one of the crossings of the pair of signal transmission lines forming the second differential signal wiring are arranged side by side.

2. The printed circuit board according to claim 1, wherein signals flowing through one of the first or second signal transmission lines included in the first differential signal wiring and one of the third or fourth signal transmission lines included in the second differential signal wiring, which are adjacent to each other without any other differential wirings therebetween when viewed in plan from the direction perpendicular to the surface of the printed wiring board, are in phase.

3. The printed circuit board according to claim 1,
wherein the second signal transmission line and the third signal transmission line are connected to the first semiconductor device in a state in which the second signal transmission line and the third signal transmission line are arranged without any other differential wirings therebetween,
wherein signals flowing through the first signal transmission line and the fourth signal transmission line are in phase, and
wherein signals flowing through the second signal transmission line and the third signal transmission line are in phase.

4. The printed circuit board according to claim 1,
wherein, when viewed in plan from the direction perpendicular to the surface of the printed wiring board, a distance between the crossings of the pair of signal transmission lines forming the first differential signal wiring and the first semiconductor device and a distance between the crossings of the pair of signal transmission lines forming the second differential signal wiring and the first semiconductor device are substantially the same, and
wherein, when viewed in plan from the direction perpendicular to the surface of the printed wiring board, a wiring length along which the first signal transmission line and the third signal transmission line are arranged adjacent to each other and a wiring length along which the second signal transmission line and the fourth signal transmission line are arranged adjacent to each other are substantially equal to each other.

5. The printed circuit board according to claim 1,
wherein the first signal transmission line comprises a first wiring pattern formed on the first semiconductor device side and a second wiring pattern formed on the second semiconductor device side when viewed from a region in which the first signal transmission line and the second signal transmission line cross with each other,
wherein the second signal transmission line comprises a third wiring pattern formed on the first semiconductor device side and a fourth wiring pattern formed on the second semiconductor device side when viewed from the region in which the first signal transmission line and the second signal transmission line cross with each other,
wherein the third signal transmission line comprises a fifth wiring pattern formed on the first semiconductor device side and a sixth wiring pattern formed on the second semiconductor device side when viewed from a region in which the third signal transmission line and the fourth signal transmission line cross with each other, wherein the fourth signal transmission line comprises a seventh wiring pattern formed on the first semiconductor device side and an eighth wiring pattern formed on the second semiconductor device side when viewed from the region in which the third signal transmission line and the fourth signal transmission line cross with each other, and wherein, when viewed in plan from the direction perpendicular to the surface of the printed wiring board, the third wiring pattern and the fifth wiring pattern are adjacent to each other, the second wiring pattern and the eighth wiring pattern are adjacent to each other, and a wiring length along which the third wiring pattern and the fifth wiring pattern are adjacent to each other and a wiring length along which the second wiring pattern and the eighth wiring pattern are adjacent to each other are substantially equal to each other.

6. The printed circuit board according to claim 1, wherein, when viewed in plan from the direction perpendicular to the surface of the printed wiring board, the first signal transmission line and the second signal transmission line are wired to cross with each other twice in the first differential signal wiring in the wiring direction thereof, wherein, when viewed in plan from the direction perpendicular to the surface of the printed wiring board, the third signal transmission line and the fourth signal transmission line are wired to cross with each other twice in the second differential signal wiring in the wiring direction thereof, wherein the first signal transmission line comprises:
  a first wiring pattern formed on the first semiconductor device side when viewed from a region in which the first signal transmission line positioned on the first semiconductor device side and the second signal transmission line cross with each other;
  a second wiring pattern formed between the region in which the first signal transmission line positioned on the first semiconductor device side and the second signal transmission line cross with each other and a region in which the first signal transmission line positioned on the second semiconductor device side and the second signal transmission line cross with each other; and
  a third wiring pattern formed on the second semiconductor device side when viewed from the region in which the first signal transmission line positioned on the second semiconductor device side and the second signal transmission line cross with each other, wherein the second signal transmission line comprises:
  a fourth wiring pattern formed on the first semiconductor device side when viewed from the region in which the first signal transmission line positioned on the first semiconductor device side and the second signal transmission line cross with each other;
  a fifth wiring pattern formed between the region in which the first signal transmission line positioned on the first semiconductor device side and the second signal transmission line cross with each other and the region in which the first signal transmission line positioned on the second semiconductor device side and the second signal transmission line cross with each other; and
  a sixth wiring pattern formed on the second semiconductor device side when viewed from the region in which the first signal transmission line positioned on the second semiconductor device side and the second signal transmission line cross with each other, wherein the third signal transmission line comprises:
  a seventh wiring pattern formed on the first semiconductor device side when viewed from a region in which a third signal transmission line positioned on the first semiconductor device side and a fourth signal transmission line cross with each other;
  an eighth wiring pattern formed between the region in which the third signal transmission line positioned on the first semiconductor device side and the fourth signal transmission line cross with each other and a region in which the third signal transmission line positioned on the second semiconductor device side and the fourth signal transmission line cross with each other; and
  a ninth wiring pattern formed on the second semiconductor device side when viewed from the region in which the third signal transmission line positioned on the second semiconductor device side and the fourth signal transmission line cross with each other, wherein the fourth signal transmission line comprises:
  a tenth wiring pattern formed on the first semiconductor device side when viewed from the region in which the third signal transmission line positioned on the first semiconductor device side and the fourth signal transmission line cross with each other;
  an eleventh wiring pattern formed between the region in which the third signal transmission line positioned on the first semiconductor device side and the fourth signal transmission line and the region in which the third signal transmission line positioned on the second semiconductor device side and the fourth signal transmission line cross with each other; and
  a twelfth wiring pattern formed on the second semiconductor device side when viewed from the region in which the third signal transmission line positioned on the second semiconductor device side and the fourth signal transmission line cross with each other, wherein, when viewed in plan from the direction perpendicular to the surface of the printed wiring board, the fourth wiring pattern and the seventh wiring pattern are adjacent to each other, the second wiring pattern and the eleventh wiring pattern are adjacent to each other, and the sixth wiring pattern and the ninth wiring pattern are adjacent to each other, and wherein, when viewed in plan from the direction perpendicular to the surface of the printed wiring board, a sum of a wiring length along which the fourth wiring pattern and the seventh wiring pattern are adjacent to each other and a wiring length along which the sixth wiring pattern and the ninth wiring pattern are adjacent to each other is substantially equal to a wiring length along which the second wiring pattern and the eleventh wiring pattern are adjacent to each other.

7. The printed circuit board according to claim 1, wherein the crossing of the pair of signal transmission lines forming the first differential signal wiring and the crossing of the pair of signal transmission lines forming the second differential signal wiring are achieved by signal vias formed in the printed wiring board.

8. The printed circuit board according to claim 1,
wherein the first semiconductor device and the second semiconductor device are formed on one surface of the printed wiring board, and
wherein the crossing of the pair of signal transmission lines forming the first differential signal wiring and the crossing of the pair of signal transmission lines forming the second differential signal wiring are achieved so that one differential signal line in the pair of differential signal lines is wired to straddle another differential signal line in the pair of differential signal lines with use of an electronic element mounted on the one surface of the printed wiring board.

9. The printed circuit board according to claim 7,
wherein the printed wiring board comprises a multilayer printed wiring board including at least three layers in which a power supply pattern and a ground pattern are formed as internal layers, and
wherein the printed wiring board has a capacitor element mounted on one of one surface and another surface thereof,
wherein the capacitor element is connected to the power supply pattern through a power supply via and is connected to the ground pattern through a ground via, and
wherein the power supply via and the ground via are formed adjacent to the signal vias.

10. The printed circuit board according to claim 8, wherein the electronic element comprises one of a resistor element and a capacitor element.

11. A printed circuit board, comprising:
a first semiconductor device comprising a first signal input/output circuit and a second signal input/output circuit;
a second semiconductor device comprising:
a third signal input/output circuit;
a first internal differential signal wiring formed of a pair of signal transmission lines, the first internal differential signal wiring being connected to the third signal input/output circuit;
a fourth signal input/output circuit; and
a second internal differential signal wiring formed of a pair of signal transmission lines, the second internal differential signal wiring being connected to the fourth signal input/output circuit and arranged in parallel to the first internal differential signal wiring; and
a printed wiring board having the first semiconductor device and the second semiconductor device mounted thereon, the printed wiring board comprising:
a first differential signal wiring formed of a pair of signal transmission lines, the first differential signal wiring connecting the first semiconductor device and the second semiconductor device to each other; and
a second differential signal wiring formed of a pair of signal transmission lines, the second differential signal wiring connecting the first semiconductor device and the second semiconductor device to each other and being arranged in parallel to the first differential signal wiring,
wherein the first differential signal wiring and the first internal differential signal wiring are connected to each other, to thereby form a pair of first differential signal transmission lines that are continuous,
wherein the second differential signal wiring and the second internal differential signal wiring are connected to each other, to thereby form a pair of second differential signal transmission lines that are continuous,
wherein the pair of first differential signal transmission lines are wired to have a relative arrangement in which one signal transmission line and another signal transmission line cross with each other in a region in which the first differential signal wiring and the first internal differential signal wiring are connected to each other, and
wherein the pair of second differential signal transmission lines are wired to have a relative arrangement in which one signal transmission line and another signal transmission line cross with each other in a region in which the second differential signal wiring and the second internal differential signal wiring are connected to each other.

12. The printed circuit board according to claim 11, wherein signals flowing through signal transmission lines adjacent to each other when viewed in plan from the direction perpendicular to the surface of the printed wiring board are in phase, one of the signal transmission lines being included in the first differential signal wiring and the other of the signal transmission lines being included in the second differential signal wiring.

13. The printed circuit board according to claim 11, wherein a length of the first differential signal wiring and the first internal differential signal wiring that are arranged in parallel to each other is longer than a length of the second differential signal wiring and the second internal differential signal wiring that are arranged in parallel to each other.

14. The printed circuit board according to claim 11, wherein the crossing of the pair of signal transmission lines forming the first differential signal transmission lines and the crossing of the pair of signal transmission lines forming the second differential signal transmission lines are achieved by signal pads formed in the second semiconductor device.

* * * * *